(12) United States Patent
Harrison et al.

(10) Patent No.: US 12,073,277 B2
(45) Date of Patent: Aug. 27, 2024

(54) RFID ANTENNA, RFID TAG AND METHOD FOR FABRICATING SUCH RFID ANTENNA

(71) Applicants: International Imaging Materials, Inc., Amherst, NY (US); The Research Foundation for the State University of New York, Buffalo, NY (US)

(72) Inventors: Daniel J. Harrison, Pittsford, NY (US); Ishita Dhopeshwar, Amherst, NY (US); Zhangyu Guan, East Amherst, NY (US)

(73) Assignees: INTERNATIONAL IMAGING MATERIALS, INC., Amherst, NY (US); THE RESEARCH FOUNDATION FOR THE STATE UNIVERSITY OF NEW YORK, Buffalo, NY (US)

( * ) Notice: Subject to any disclaimer, the term of this patent is extended or adjusted under 35 U.S.C. 154(b) by 0 days.

(21) Appl. No.: 18/099,015

(22) Filed: Jan. 19, 2023

(65) Prior Publication Data

US 2024/0249108 A1 Jul. 25, 2024

(51) Int. Cl.
G06K 19/077 (2006.01)
H01Q 1/22 (2006.01)
H05K 3/20 (2006.01)

(52) U.S. Cl.
CPC ..... *G06K 19/07773* (2013.01); *H01Q 1/2225* (2013.01); *H05K 3/20* (2013.01)

(58) Field of Classification Search
CPC .......... G06K 19/07773; H01Q 1/2225; H05K 3/20

USPC .......................................................... 235/492
See application file for complete search history.

(56) References Cited

U.S. PATENT DOCUMENTS

| | | | | |
|---|---|---|---|---|
| 9,715,609 | B1 * | 7/2017 | Fink | H04B 7/0408 |
| 11,687,741 | B1 * | 6/2023 | Colby | G07G 1/009 |
| | | | | 705/72 |
| 11,790,191 | B2 * | 10/2023 | Turner | G06K 7/10297 |
| | | | | 340/572.1 |
| 2006/0012482 | A1 * | 1/2006 | Zalud | G06K 19/0723 |
| | | | | 235/492 |
| 2012/0018504 | A1 * | 1/2012 | Jiang | G06K 19/07749 |
| | | | | 235/375 |
| 2013/0292347 | A1 * | 11/2013 | Liu | A47B 63/00 |
| | | | | 211/42 |
| 2014/0209691 | A1 * | 7/2014 | Finn | H01F 27/363 |
| | | | | 235/492 |
| 2016/0275769 | A1 * | 9/2016 | McIntosh | G08B 13/2414 |
| 2018/0060622 | A1 * | 3/2018 | Pilzner | G06K 19/07705 |
| 2020/0242904 | A1 * | 7/2020 | Ouellette | G06V 20/52 |
| 2021/0255641 | A1 * | 8/2021 | Tang | B64C 39/024 |
| 2022/0052435 | A1 * | 2/2022 | Raynesford | G06K 7/0008 |
| 2022/0102855 | A1 * | 3/2022 | Jia | H01Q 1/243 |
| 2023/0244884 | A1 * | 8/2023 | Venture | G06K 7/10168 |
| | | | | 340/10.1 |

OTHER PUBLICATIONS

Zhu et al., "Impedance Measurement for Balanced UHF RFID Tag Antennas", 2010 IEEE Radio and Wireless Symposium (RWS), New Orleans, LA, USA, 2010, pp. 128-131.

\* cited by examiner

*Primary Examiner* — Allyson N Trail
(74) *Attorney, Agent, or Firm* — NIXON & VANDERHYE

(57) ABSTRACT

Disclosed is an RFID antenna including: a central inductive circuit; and at least two lobes extending radially from the central inductive circuit.

23 Claims, 11 Drawing Sheets

RFID ANTENNA, RFID TAG AND METHOD FOR FABRICATING SUCH RFID ANTENNA

TECHNICAL FIELD OF THE INVENTION

The present invention concerns a RFID antenna. The present invention also relates to a RIFD tag comprising such RFID antenna and to a method for fabricating said RFID tag.

BACKGROUND OF THE INVENTION

Radio-frequency identification (RFID) has become a very important identification and tracking tool for packaged goods, second only to bar codes and text. For achieving such operations, RFID technique uses electromagnetic fields to automatically identify and track RFID tags attached to objects.

Such RFID tags have enabled the rapid deployment of wireless auto-identification of products, parts, supplies, equipment, and animals. RFID tags are attached to or incorporated into items or their packaging and programed with variable identification information specific to the item. RFID tags may be incorporated into packages either by attachment of an RFID inlay tag or an RFID enabled label to the package.

However, in practice, the detection of RFID tags is not satisfying because the reading range is very short.

SUMMARY OF THE INVENTION

There is therefore a need for a RIFD antenna with a longer reading range.

To this end, the specification describes a RFID antenna comprising:
 a central inductive circuit, and
 at least two lobes extending radially from the central inductive circuit.

According to further aspects of the RFID antenna, which are advantageous but not compulsory, the RFID antenna might incorporate one or several of the following features, taken in any technically admissible combination:
 each lobe belongs to a respective lobe pair, two lobes of the same lobe pair being symmetrical with relation to the central inductive circuit.
 the at least two lobes comprises primary lobes and at least one side lobe, the angle between the side lobe and one of the primary lobes being less than 90.
 the angle between the side lobe and one of the primary lobes is less than 60°.
 a width and a length is defined for each lobe, the width of each side lobe being less than the smallest width of the primary lobes and the length of each side lobe being less than the smallest length of the primary lobes.
 the area of the central inductive circuit is less than 300 mm$^2$.
 the central inductive circuit extends between an internal periphery and the external periphery, the ratio of the area of the central inductive circuit and the area of the internal periphery being comprised between 0.18 and 2.75.
 an aspect ratio is defined for each lobe, the aspect ratio of each lobe being comprised between 0.25 and 2.00.
 the aspect ratio of each lobe is less than 1.00.
 a minimum width is defined for each lobe, the minimum width of each lobe being greater than 0.1 mm.
 the central inductive circuit extends from an internal periphery to an external periphery for which respective diameters are defined, the diameter of the internal periphery being comprised between 8.0 mm and 20.0 mm.
 the difference between the diameters of the internal periphery to the external periphery is greater than 5.0 mm.
 the lobes and the central inductive circuit are made of the same conductive material.
 a length is defined for the antenna, the length of the antenna being greater than 40 mm.
 the length of the antenna is comprised between 80 mm and 100 mm.
 the RFID antenna is adapted to receive and transmit signals at frequencies belonging to a frequency domain extending from 860 MHz to 960 MHz.
 the number of lobes is an even number.
 the number of lobes is comprised between 2 and 10.
 the lobes are placed symmetrically about the central inductive circuit.
 the length of the antenna is greater than 50 mm, more preferably greater than 80 mm and most preferably greater than or equal to 100 mm.
 the length of the antenna is comprised between 80 mm and 100 mm.
 the length of the antenna is equal to 80 mm with a 10% margin, preferably a 5% margin, advantageously 2% margin and more preferably 1% margin. A quantity A is equal to B with a X % margin when the quantity is comprised between (1−X %)*B and (1+X %)*B.
 the length of the antenna is equal to 100 mm with a 10% margin, preferably a 5% margin, advantageously 2% margin and more preferably 1% margin.
 a maximum width is defined for a lobe as the maximum dimension along an axis orthogonal to a symmetry axis of the lobe.
 the maximum width of the lobe is comprised between 10 mm and 50 mm.
 the maximum width of the lobe is equal to 10 mm with a 10% margin, preferably a 5% margin, advantageously 2% margin and more preferably 1% margin.
 the maximum width of the lobe is equal to 15 mm with a 10% margin, preferably a 5% margin, advantageously 2% margin and more preferably 1% margin.
 the maximum width of the lobe is equal to 20 mm with a 10% margin, preferably a 5% margin, advantageously 2% margin and more preferably 1% margin.
 the maximum width of the lobe is equal to 30 mm with a 10% margin, preferably a 5% margin, advantageously 2% margin and more preferably 1% margin.
 the maximum width of the lobe is equal to 50 mm with a 10% margin, preferably a 5% margin, advantageously 2% margin and more preferably 1% margin.
 a length is defined for the lobe as the maximum distance between the orthogonal projections of two points of the lobe on a symmetry axis of the lobe.
 the length of the lobe is comprised between 20 mm and 60 mm.
 the length of the lobe is equal to 20 mm with a 10% margin, preferably a 5% margin, advantageously 2% margin and more preferably 1% margin.
 the length of the lobe is equal to 25 mm with a 10% margin, preferably a 5% margin, advantageously 2% margin and more preferably 1% margin.
 the length of the lobe is equal to 30 mm with a 10% margin, preferably a 5% margin, advantageously 2% margin and more preferably 1% margin.

the length of the lobe is equal to 35 mm with a 10% margin, preferably a 5% margin, advantageously 2% margin and more preferably 1% margin.

the length of the lobe is equal to 40 mm with a 10% margin, preferably a 5% margin, advantageously 2% margin and more preferably 1% margin.

the length of the lobe is equal to 45 mm with a 10% margin, preferably a 5% margin, advantageously 2% margin and more preferably 1% margin.

the length of the lobe is equal to 50 mm with a 10% margin, preferably a 5% margin, advantageously 2% margin and more preferably 1% margin.

the length of the lobe is equal to 60 mm with a 10% margin, preferably a 5% margin, advantageously 2% margin and more preferably 1% margin.

an internal diameter is defined for the central inductive circuit as the diameter of the internal periphery of the central inductive circuit.

the internal diameter of the central inductive circuit is comprised between 7 mm and 30 mm.

the internal diameter of the central inductive circuit is equal to 7 mm with a 10% margin, preferably a 5% margin, advantageously 2% margin and more preferably 1% margin.

the internal diameter of the central inductive circuit is equal to 7.5 mm with a 10% margin, preferably a 5% margin, advantageously 2% margin and more preferably 1% margin.

the internal diameter of the central inductive circuit is equal to 8 mm with a 10% margin, preferably a 5% margin, advantageously 2% margin and more preferably 1% margin.

the internal diameter of the central inductive circuit is equal to 8.5 mm with a 10% margin, preferably a 5% margin, advantageously 2% margin and more preferably 1% margin.

the internal diameter of the central inductive circuit is equal to 9 mm with a 10% margin, preferably a 5% margin, advantageously 2% margin and more preferably 1% margin.

the internal diameter of the central inductive circuit is equal to 9.5 mm with a 10% margin, preferably a 5% margin, advantageously 2% margin and more preferably 1% margin.

the internal diameter of the central inductive circuit is equal to 10 mm with a 10% margin, preferably a 5% margin, advantageously 2% margin and more preferably 1% margin.

the internal diameter of the central inductive circuit is equal to 12 mm with a 10% margin, preferably a 5% margin, advantageously 2% margin and more preferably 1% margin.

the internal diameter of the central inductive circuit is equal to 15 mm with a 10% margin, preferably a 5% margin, advantageously 2% margin and more preferably 1% margin.

the internal diameter of the central inductive circuit is equal to 16 mm with a 10% margin, preferably a 5% margin, advantageously 2% margin and more preferably 1% margin.

the internal diameter of the central inductive circuit is equal to 17 mm with a 10% margin, preferably a 5% margin, advantageously 2% margin and more preferably 1% margin.

the internal diameter of the central inductive circuit is equal to 18 mm with a 10% margin, preferably a 5% margin, advantageously 2% margin and more preferably 1% margin.

the internal diameter of the central inductive circuit is equal to 19 mm with a 10% margin, preferably a 5% margin, advantageously 2% margin and more preferably 1% margin.

the internal diameter of the central inductive circuit is equal to 20 mm with a 10% margin, preferably a 5% margin, advantageously 2% margin and more preferably 1% margin.

the internal diameter of the central inductive circuit is equal to 25 mm with a 10% margin, preferably a 5% margin, advantageously 2% margin and more preferably 1% margin.

the internal diameter of the central inductive circuit is equal to 30 mm with a 10% margin, preferably a 5% margin, advantageously 2% margin and more preferably 1% margin.

an external diameter is defined for the central inductive circuit as the diameter of the external periphery of the central inductive circuit.

the external diameter of the central inductive circuit is comprised between 8 mm and 40 mm.

the external diameter of the central inductive circuit is equal to 8.8 mm with a 10% margin, preferably a 5% margin, advantageously 2% margin and more preferably 1% margin.

the external diameter of the central inductive circuit is equal to 10 mm with a 10% margin, preferably a 5% margin, advantageously 2% margin and more preferably 1% margin.

the external diameter of the central inductive circuit is equal to 11 mm with a 10% margin, preferably a 5% margin, advantageously 2% margin and more preferably 1% margin.

the external diameter of the central inductive circuit is equal to 12 mm with a 10% margin, preferably a 5% margin, advantageously 2% margin and more preferably 1% margin.

the external diameter of the central inductive circuit is equal to 14 mm with a 10% margin, preferably a 5% margin, advantageously 2% margin and more preferably 1% margin.

the external diameter of the central inductive circuit is equal to 15 mm with a 10% margin, preferably a 5% margin, advantageously 2% margin and more preferably 1% margin.

the external diameter of the central inductive circuit is equal to 18 mm with a 10% margin, preferably a 5% margin, advantageously 2% margin and more preferably 1% margin.

the external diameter of the central inductive circuit is equal to 20 mm with a 10% margin, preferably a 5% margin, advantageously 2% margin and more preferably 1% margin.

the external diameter of the central inductive circuit is equal to 25 mm with a 10% margin, preferably a 5% margin, advantageously 2% margin and more preferably 1% margin.

the external diameter of the central inductive circuit is equal to 26 mm with a 10% margin, preferably a 5% margin, advantageously 2% margin and more preferably 1% margin.

the external diameter of the central inductive circuit is equal to 27 mm with a 10% margin, preferably a 5% margin, advantageously 2% margin and more preferably 1% margin.

the external diameter of the central inductive circuit is equal to 28 mm with a 10% margin, preferably a 5% margin, advantageously 2% margin and more preferably 1% margin.

the external diameter of the central inductive circuit is equal to 29 mm with a 10% margin, preferably a 5% margin, advantageously 2% margin and more preferably 1% margin.

the external diameter of the central inductive circuit is equal to 35 mm with a 10% margin, preferably a 5% margin, advantageously 2% margin and more preferably 1% margin.

the external diameter of the central inductive circuit is equal to 40 mm with a 10% margin, preferably a 5% margin, advantageously 2% margin and more preferably 1% margin.

the width of the central inductive circuit is comprised between 8.0 and 20.0.

the width of the central inductive circuit is equal to 8.0 mm with a 10% margin, preferably a 5% margin, advantageously 2% margin and more preferably 1% margin.

the width of the central inductive circuit is equal to 9 mm with a 10% margin, preferably a 5% margin, advantageously 2% margin and more preferably 1% margin.

the width of the central inductive circuit is equal to 10 mm with a 10% margin, preferably a 5% margin, advantageously 2% margin and more preferably 1% margin.

the width of the central inductive circuit is equal to 11 mm with a 10% margin, preferably a 5% margin, advantageously 2% margin and more preferably 1% margin.

the width of the central inductive circuit is equal to 12 mm with a 10% margin, preferably a 5% margin, advantageously 2% margin and more preferably 1% margin.

the width of the central inductive circuit is equal to 13 mm with a 10% margin, preferably a 5% margin, advantageously 2% margin and more preferably 1% margin.

the width of the central inductive circuit is equal to 14 mm with a 10% margin, preferably a 5% margin, advantageously 2% margin and more preferably 1% margin.

the width of the central inductive circuit is equal to 15 mm with a 10% margin, preferably a 5% margin, advantageously 2% margin and more preferably 1% margin.

the width of the central inductive circuit is equal to 16 mm with a 10% margin, preferably a 5% margin, advantageously 2% margin and more preferably 1% margin.

the width of the central inductive circuit is equal to 17 mm with a 10% margin, preferably a 5% margin, advantageously 2% margin and more preferably 1% margin.

the width of the central inductive circuit is equal to 18 mm with a 10% margin, preferably a 5% margin, advantageously 2% margin and more preferably 1% margin.

the width of the central inductive circuit is equal to 19 mm with a 10% margin, preferably a 5% margin, advantageously 2% margin and more preferably 1% margin.

the width of the central inductive circuit is equal to 20.0 mm with a 10% margin, preferably a 5% margin, advantageously 2% margin and more preferably 1% margin.

a major axis and minor axis are defined for the central inductive circuit.

the major axis of the central inductive circuit is comprised between 4.0 mm and 25.0 mm.

the major axis of the central inductive circuit is equal to 4.4 mm with a 10% margin, preferably a 5% margin, advantageously 2% margin and more preferably 1% margin.

the major axis of the central inductive circuit is equal to 5 mm with a 10% margin, preferably a 5% margin, advantageously 2% margin and more preferably 1% margin.

the major axis of the central inductive circuit is equal to 6 mm with a 10% margin, preferably a 5% margin, advantageously 2% margin and more preferably 1% margin.

the major axis of the central inductive circuit is equal to 7 mm with a 10% margin, preferably a 5% margin, advantageously 2% margin and more preferably 1% margin.

the major axis of the central inductive circuit is equal to 9 mm with a 10% margin, preferably a 5% margin, advantageously 2% margin and more preferably 1% margin.

the major axis of the central inductive circuit is equal to 10 mm with a 10% margin, preferably a 5% margin, advantageously 2% margin and more preferably 1% margin.

the major axis of the central inductive circuit is equal to 12 mm with a 10% margin, preferably a 5% margin, advantageously 2% margin and more preferably 1% margin.

the major axis of the central inductive circuit is equal to 13 mm with a 10% margin, preferably a 5% margin, advantageously 2% margin and more preferably 1% margin.

the major axis of the central inductive circuit is equal to 14 mm with a 10% margin, preferably a 5% margin, advantageously 2% margin and more preferably 1% margin.

the major axis of the central inductive circuit is equal to 20.0 mm with a 10% margin, preferably a 5% margin, advantageously 2% margin and more preferably 1% margin.

the minor axis of the central inductive circuit is comprised between 3.0 mm and 15.0 mm.

the minor axis of the central inductive circuit is equal to 3.5 mm with a 10% margin, preferably a 5% margin, advantageously 2% margin and more preferably 1% margin.

the minor axis of the central inductive circuit is equal to 4.0 mm with a 10% margin, preferably a 5% margin, advantageously 2% margin and more preferably 1% margin.

the minor axis of the central inductive circuit is equal to 4.5 mm with a 10% margin, preferably a 5% margin, advantageously 2% margin and more preferably 1% margin.

the minor axis of the central inductive circuit is equal to 5.0 mm with a 10% margin, preferably a 5% margin, advantageously 2% margin and more preferably 1% margin.

the minor axis of the central inductive circuit is equal to 7.5 mm with a 10% margin, preferably a 5% margin, advantageously 2% margin and more preferably 1% margin.

the minor axis of the central inductive circuit is equal to 8.0 mm with a 10% margin, preferably a 5% margin, advantageously 2% margin and more preferably 1% margin.

the minor axis of the central inductive circuit is equal to 9.0 mm with a 10% margin, preferably a 5% margin, advantageously 2% margin and more preferably 1% margin.

the minor axis of the central inductive circuit is equal to 10.0 mm with a 10% margin, preferably a 5% margin, advantageously 2% margin and more preferably 1% margin.

the minor axis of the central inductive circuit is equal to 12.5 mm with a 10% margin, preferably a 5% margin, advantageously 2% margin and more preferably 1% margin.

the lobe comprising a proximal segment, the length of the proximal segment is the minimum width of the lobe.

the minimum width of the lobe is comprised between 0.4 mm and 10 mm.

the minimum width of the lobe is equal to 0.4 mm with a 10% margin, preferably a 5% margin, advantageously 2% margin and more preferably 1% margin.

the minimum width of the lobe is equal to 0.5 mm with a 10% margin, preferably a 5% margin, advantageously 2% margin and more preferably 1% margin.

the minimum width of the lobe is equal to 1 mm with a 10% margin, preferably a 5% margin, advantageously 2% margin and more preferably 1% margin.

the minimum width of the lobe is equal to 1.5 mm with a 10% margin, preferably a 5% margin, advantageously 2% margin and more preferably 1% margin.

the minimum width of the lobe is equal to 2 mm with a 10% margin, preferably a 5% margin, advantageously 2% margin and more preferably 1% margin.

the minimum width of the lobe is equal to 2.5 mm with a 10% margin, preferably a 5% margin, advantageously 2% margin and more preferably 1% margin.

the minimum width of the lobe is equal to 3 mm with a 10% margin, preferably a 5% margin, advantageously 2% margin and more preferably 1% margin.

the minimum width of the lobe is equal to 4 mm with a 10% margin, preferably a 5% margin, advantageously 2% margin and more preferably 1% margin.

the minimum width of the lobe is equal to 5 mm with a 10% margin, preferably a 5% margin, advantageously 2% margin and more preferably 1% margin.

the minimum width of the lobe is equal to 7.5 mm with a 10% margin, preferably a 5% margin, advantageously 2% margin and more preferably 1% margin.

the minimum width of the lobe is equal to 10 mm with a 10% margin, preferably a 5% margin, advantageously 2% margin and more preferably 1% margin.

the area of the central inductive circuit is comprised between 5.0 mm$^2$ and 475 mm$^2$.

the area of the central inductive circuit is equal to 5.3 mm$^2$ with a 10% margin, preferably a 5% margin, advantageously 2% margin and more preferably 1% margin.

the area of the central inductive circuit is equal to 14.1 mm$^2$ with a 10% margin, preferably a 5% margin, advantageously 2% margin and more preferably 1% margin.

the area of the central inductive circuit is equal to 17.5 mm$^2$ with a 10% margin, preferably a 5% margin, advantageously 2% margin and more preferably 1% margin.

the area of the central inductive circuit is equal to 18.25 mm$^2$ with a 10% margin, preferably a 5% margin, advantageously 2% margin and more preferably 1% margin.

the area of the central inductive circuit is equal to 20.0 mm$^2$ with a 10% margin, preferably a 5% margin, advantageously 2% margin and more preferably 1% margin.

the area of the central inductive circuit is equal to 22.8 mm$^2$ with a 10% margin, preferably a 5% margin, advantageously 2% margin and more preferably 1% margin.

the area of the central inductive circuit is equal to 23.6 mm$^2$ with a 10% margin, preferably a 5% margin, advantageously 2% margin and more preferably 1% margin.

the area of the central inductive circuit is equal to 28.3 mm$^2$ with a 10% margin, preferably a 5% margin, advantageously 2% margin and more preferably 1% margin.

the area of the central inductive circuit is equal to 29.8 mm$^2$ with a 10% margin, preferably a 5% margin, advantageously 2% margin and more preferably 1% margin.

the area of the central inductive circuit is equal to 31.4 mm$^2$ with a 10% margin, preferably a 5% margin, advantageously 2% margin and more preferably 1% margin.

the area of the central inductive circuit is equal to 34.7 mm$^2$ with a 10% margin, preferably a 5% margin, advantageously 2% margin and more preferably 1% margin.

the area of the central inductive circuit is equal to 37.3 mm$^2$ with a 10% margin, preferably a 5% margin, advantageously 2% margin and more preferably 1% margin.

the area of the central inductive circuit is equal to 48.8 mm$^2$ with a 10% margin, preferably a 5% margin, advantageously 2% margin and more preferably 1% margin.

the area of the central inductive circuit is equal to 50.2 mm$^2$ with a 10% margin, preferably a 5% margin, advantageously 2% margin and more preferably 1% margin.

the area of the central inductive circuit is equal to 51.2 mm$^2$ with a 10% margin, preferably a 5% margin, advantageously 2% margin and more preferably 1% margin.

the area of the central inductive circuit is equal to 51.8 mm$^2$ with a 10% margin, preferably a 5% margin, advantageously 2% margin and more preferably 1% margin.

the area of the central inductive circuit is equal to 54.2 mm$^2$ with a 10% margin, preferably a 5% margin, advantageously 2% margin and more preferably 1% margin.

the area of the central inductive circuit is equal to 55.7 mm$^2$ with a 10% margin, preferably a 5% margin, advantageously 2% margin and more preferably 1% margin.

the area of the central inductive circuit is equal to 57.3 mm$^2$ with a 10% margin, preferably a 5% margin, advantageously 2% margin and more preferably 1% margin.

the area of the central inductive circuit is equal to 60.6 mm$^2$ with a 10% margin, preferably a 5% margin, advantageously 2% margin and more preferably 1% margin.

the area of the central inductive circuit is equal to 61.2 mm² with a 10% margin, preferably a 5% margin, advantageously 2% margin and more preferably 1% margin.

the area of the central inductive circuit is equal to 63.2 mm² with a 10% margin, preferably a 5% margin, advantageously 2% margin and more preferably 1% margin.

the area of the central inductive circuit is equal to 67.5 mm² with a 10% margin, preferably a 5% margin, advantageously 2% margin and more preferably 1% margin.

the area of the central inductive circuit is equal to 70.7 mm² with a 10% margin, preferably a 5% margin, advantageously 2% margin and more preferably 1% margin.

the area of the central inductive circuit is equal to 87.9 mm² with a 10% margin, preferably a 5% margin, advantageously 2% margin and more preferably 1% margin.

the area of the central inductive circuit is equal to 102.1 mm² with a 10% margin, preferably a 5% margin, advantageously 2% margin and more preferably 1% margin.

the area of the central inductive circuit is equal to 157.0 mm² with a 10% margin, preferably a 5% margin, advantageously 2% margin and more preferably 1% margin.

the area of the central inductive circuit is equal to 168.8 mm² with a 10% margin, preferably a 5% margin, advantageously 2% margin and more preferably 1% margin.

the area of the central inductive circuit is equal to 180.6 mm² with a 10% margin, preferably a 5% margin, advantageously 2% margin and more preferably 1% margin.

the area of the central inductive circuit is equal to 184.5 mm² with a 10% margin, preferably a 5% margin, advantageously 2% margin and more preferably 1% margin.

the area of the central inductive circuit is equal to 200.0 mm² with a 10% margin, preferably a 5% margin, advantageously 2% margin and more preferably 1% margin.

the area of the central inductive circuit is equal to 226.0 mm² with a 10% margin, preferably a 5% margin, advantageously 2% margin and more preferably 1% margin.

the area of the central inductive circuit is equal to 304.2 mm² with a 10% margin, preferably a 5% margin, advantageously 2% margin and more preferably 1% margin.

the area of the central inductive circuit is equal to 471.0 mm² with a 10% margin, preferably a 5% margin, advantageously 2% margin and more preferably 1% margin.

the area of the surface delimited by the internal periphery is comprised between 19.0 mm² and 250.0 mm².

the area of the surface delimited by the internal periphery is equal to 19.2 mm² with a 10% margin, preferably a 5% margin, advantageously 2% margin and more preferably 1% margin.

the area of the surface delimited by the internal periphery is equal to 21.7 mm² with a 10% margin, preferably a 5% margin, advantageously 2% margin and more preferably 1% margin.

the area of the surface delimited by the internal periphery is equal to 25.1 mm² with a 10% margin, preferably a 5% margin, advantageously 2% margin and more preferably 1% margin.

the area of the surface delimited by the internal periphery is equal to 26.7 mm² with a 10% margin, preferably a 5% margin, advantageously 2% margin and more preferably 1% margin.

the area of the surface delimited by the internal periphery is equal to 28.3 mm² with a 10% margin, preferably a 5% margin, advantageously 2% margin and more preferably 1% margin.

the area of the surface delimited by the internal periphery is equal to 33.6 mm² with a 10% margin, preferably a 5% margin, advantageously 2% margin and more preferably 1% margin.

the area of the surface delimited by the internal periphery is equal to 39.3 mm² with a 10% margin, preferably a 5% margin, advantageously 2% margin and more preferably 1% margin.

the area of the surface delimited by the internal periphery is equal to 47.1 mm² with a 10% margin, preferably a 5% margin, advantageously 2% margin and more preferably 1% margin.

the area of the surface delimited by the internal periphery is equal to 50.2 mm² with a 10% margin, preferably a 5% margin, advantageously 2% margin and more preferably 1% margin.

the area of the surface delimited by the internal periphery is equal to 53.3 mm² with a 10% margin, preferably a 5% margin, advantageously 2% margin and more preferably 1% margin.

the area of the surface delimited by the internal periphery is equal to 56.5 mm² with a 10% margin, preferably a 5% margin, advantageously 2% margin and more preferably 1% margin.

the area of the surface delimited by the internal periphery is equal to 59.6 mm² with a 10% margin, preferably a 5% margin, advantageously 2% margin and more preferably 1% margin.

the area of the surface delimited by the internal periphery is equal to 88.3 mm² with a 10% margin, preferably a 5% margin, advantageously 2% margin and more preferably 1% margin.

the area of the surface delimited by the internal periphery is equal to 94.2 mm² with a 10% margin, preferably a 5% margin, advantageously 2% margin and more preferably 1% margin.

the area of the surface delimited by the internal periphery is equal to 100.5 mm² with a 10% margin, preferably a 5% margin, advantageously 2% margin and more preferably 1% margin.

the area of the surface delimited by the internal periphery is equal to 106.7 mm² with a 10% margin, preferably a 5% margin, advantageously 2% margin and more preferably 1% margin.

the area of the surface delimited by the internal periphery is equal to 127.2 mm² with a 10% margin, preferably a 5% margin, advantageously 2% margin and more preferably 1% margin.

the area of the surface delimited by the internal periphery is equal to 134.2 mm² with a 10% margin, preferably a 5% margin, advantageously 2% margin and more preferably 1% margin.

the area of the surface delimited by the internal periphery is equal to 157.0 mm² with a 10% margin, preferably a 5% margin, advantageously 2% margin and more preferably 1% margin.

the area of the surface delimited by the internal periphery is equal to 245.3 mm² with a 10% margin, preferably a 5% margin, advantageously 2% margin and more preferably 1% margin.

the ratio between the area of the central inductive circuit and the area of the surface delimited by the internal periphery is comprised between 0.2 and 4.2.

the ratio between the area of the central inductive circuit and the area of the surface delimited by the internal periphery is equal to 0.2 with a 10% margin, preferably a 5% margin, advantageously 2% margin and more preferably 1% margin.

the ratio between the area of the central inductive circuit and the area of the surface delimited by the internal periphery is equal to 0.5 with a 10% margin, preferably a 5% margin, advantageously 2% margin and more preferably 1% margin.

the ratio between the area of the central inductive circuit and the area of the surface delimited by the internal periphery is equal to 0.6 with a 10% margin, preferably a 5% margin, advantageously 2% margin and more preferably 1% margin.

the ratio between the area of the central inductive circuit and the area of the surface delimited by the internal periphery is equal to 0.8 with a 10% margin, preferably a 5% margin, advantageously 2% margin and more preferably 1% margin.

the ratio between the area of the central inductive circuit and the area of the surface delimited by the internal periphery is equal to 0.9 with a 10% margin, preferably a 5% margin, advantageously 2% margin and more preferably 1% margin.

the ratio between the area of the central inductive circuit and the area of the surface delimited by the internal periphery is equal to 1.0 with a 10% margin, preferably a 5% margin, advantageously 2% margin and more preferably 1% margin.

the ratio between the area of the central inductive circuit and the area of the surface delimited by the internal periphery is equal to 1.1 with a 10% margin, preferably a 5% margin, advantageously 2% margin and more preferably 1% margin.

the ratio between the area of the central inductive circuit and the area of the surface delimited by the internal periphery is equal to 1.2 with a 10% margin, preferably a 5% margin, advantageously 2% margin and more preferably 1% margin.

the ratio between the area of the central inductive circuit and the area of the surface delimited by the internal periphery is equal to 1.3 with a 10% margin, preferably a 5% margin, advantageously 2% margin and more preferably 1% margin.

the ratio between the area of the central inductive circuit and the area of the surface delimited by the internal periphery is equal to 1.4 with a 10% margin, preferably a 5% margin, advantageously 2% margin and more preferably 1% margin.

the ratio between the area of the central inductive circuit and the area of the surface delimited by the internal periphery is equal to 1.5 with a 10% margin, preferably a 5% margin, advantageously 2% margin and more preferably 1% margin.

the ratio between the area of the central inductive circuit and the area of the surface delimited by the internal periphery is equal to 1.6 with a 10% margin, preferably a 5% margin, advantageously 2% margin and more preferably 1% margin.

the ratio between the area of the central inductive circuit and the area of the surface delimited by the internal periphery is equal to 1.7 with a 10% margin, preferably a 5% margin, advantageously 2% margin and more preferably 1% margin.

the ratio between the area of the central inductive circuit and the area of the surface delimited by the internal periphery is equal to 1.9 with a 10% margin, preferably a 5% margin, advantageously 2% margin and more preferably 1% margin.

the ratio between the area of the central inductive circuit and the area of the surface delimited by the internal periphery is equal to 2.1 with a 10% margin, preferably a 5% margin, advantageously 2% margin and more preferably 1% margin.

the ratio between the area of the central inductive circuit and the area of the surface delimited by the internal periphery is equal to 2.2 with a 10% margin, preferably a 5% margin, advantageously 2% margin and more preferably 1% margin.

the ratio between the area of the central inductive circuit and the area of the surface delimited by the internal periphery is equal to 2.3 with a 10% margin, preferably a 5% margin, advantageously 2% margin and more preferably 1% margin.

the ratio between the area of the central inductive circuit and the area of the surface delimited by the internal periphery is equal to 2.8 with a 10% margin, preferably a 5% margin, advantageously 2% margin and more preferably 1% margin.

the ratio between the area of the central inductive circuit and the area of the surface delimited by the internal periphery is equal to 3.0 with a 10% margin, preferably a 5% margin, advantageously 2% margin and more preferably 1% margin.

the ratio between the area of the central inductive circuit and the area of the surface delimited by the internal periphery is equal to 4.1 with a 10% margin, preferably a 5% margin, advantageously 2% margin and more preferably 1% margin.

the aspect ratio of a lobe is the ratio between the maximum width of the lobe and the length of the lobe.

the aspect ratio of the lobe is comprised between 0.25 and 2.00.

the aspect ratio of the lobe is comprised between 0.25 and 1.00.

the aspect ratio of the lobe is comprised between 0.25 and 2.00.

the aspect ratio of the lobe is comprised between 0.25 and 0.80.

the aspect ratio of the lobe is comprised between 0.25 and 0.50.

the aspect ratio of the lobe is comprised between 0.30 and 0.50.

the aspect ratio of the lobe is comprised between 0.30 and 0.40.

the aspect ratio of the lobe is equal to 0.27 with a 10% margin, preferably a 5% margin, advantageously 2% margin and more preferably 1% margin.

the aspect ratio of the lobe is equal to 0.33 with a 10% margin, preferably a 5% margin, advantageously 2% margin and more preferably 1% margin.

the aspect ratio of the lobe is equal to 0.34 with a 10% margin, preferably a 5% margin, advantageously 2% margin and more preferably 1% margin.
the aspect ratio of the lobe is equal to 0.35 with a 10% margin, preferably a 5% margin, advantageously 2% margin and more preferably 1% margin.
the aspect ratio of the lobe is equal to 0.36 with a 10% margin, preferably a 5% margin, advantageously 2% margin and more preferably 1% margin.
the aspect ratio of the lobe is equal to 0.37 with a 10% margin, preferably a 5% margin, advantageously 2% margin and more preferably 1% margin.
the aspect ratio of the lobe is equal to 0.38 with a 10% margin, preferably a 5% margin, advantageously 2% margin and more preferably 1% margin.
the aspect ratio of the lobe is equal to 0.40 with a 10% margin, preferably a 5% margin, advantageously 2% margin and more preferably 1% margin.
the aspect ratio of the lobe is equal to 0.41 with a 10% margin, preferably a 5% margin, advantageously 2% margin and more preferably 1% margin.
the aspect ratio of the lobe is equal to 0.42 with a 10% margin, preferably a 5% margin, advantageously 2% margin and more preferably 1% margin.
the aspect ratio of the lobe is equal to 0.46 with a 10% margin, preferably a 5% margin, advantageously 2% margin and more preferably 1% margin.
the aspect ratio of the lobe is equal to 0.50 with a 10% margin, preferably a 5% margin, advantageously 2% margin and more preferably 1% margin.
the aspect ratio of the lobe is equal to 0.53 with a 10% margin, preferably a 5% margin, advantageously 2% margin and more preferably 1% margin.
the aspect ratio of the lobe is equal to 0.80 with a 10% margin, preferably a 5% margin, advantageously 2% margin and more preferably 1% margin.
the aspect ratio of the lobe is equal to 1.02 with a 10% margin, preferably a 5% margin, advantageously 2% margin and more preferably 1% margin.
the aspect ratio of the lobe is equal to 1.09 with a 10% margin, preferably a 5% margin, advantageously 2% margin and more preferably 1% margin.
the aspect ratio of the lobe is equal to 1.33 with a 10% margin, preferably a 5% margin, advantageously 2% margin and more preferably 1% margin.
the aspect ratio of the lobe is equal to 1.82 with a 10% margin, preferably a 5% margin, advantageously 2% margin and more preferably 1% margin.
the inter-lobe angle is comprised between 25° and 70°, preferably comprised between 30° and 60°.
the inter-lobe angle is equal to 30° with a 10% margin, preferably a 5% margin, advantageously 2% margin and more preferably 1% margin.
the inter-lobe angle is equal to 35° with a 10% margin, preferably a 5% margin, advantageously 2% margin and more preferably 1% margin.
the inter-lobe angle is equal to 45° with a 10% margin, preferably a 5% margin, advantageously 2% margin and more preferably 1% margin.
the inter-lobe angle is equal to 60° with a 10% margin, preferably a 5% margin, advantageously 2% margin and more preferably 1% margin.

The specification also concerns a RFID tag comprising a RFID antenna as previously described, and an RFID chip wherein said RFID chip is electrically connected to said central inductive circuit of said RFID antenna.

The specification also relates to a method for manufacturing a RFID tag, the method for manufacturing comprising a step of forming a RFID antenna on a substrate, the RFID antenna comprising:
 a central inductive circuit, and
 at least two lobes extending radially from the central inductive circuit,
the step of forming being carried out using a process chosen among a conductive metal transfer printing, conductive inkjet printing and conductive screen printing.

According to further aspects of the method, which are advantageous but not compulsory, the method for fabricating might incorporate one or several of the following features, taken in any technically admissible combination:
 the method for manufacturing comprises:
  cutting a RFID antenna from a metal foil, the RFID antenna comprising:
   a central inductive circuit, and
   at least two lobes extending radially from the central inductive circuit, and
  adhesively attach the RFID antenna to the substrate.
 the method for manufacturing comprises:
  a step of providing a substrate metallized with a continuous layer of metal,
  a step of forming a RFID antenna comprising:
   a central inductive circuit, and
   at least two lobes extending radially from the central inductive circuit,
 the step of forming being carried out by removing metal from the substrate outside of the areas devoted to form the RFID antenna by using a chemical technique or mechanical etching.

BRIEF DESCRIPTION OF THE DRAWINGS

The invention will be better understood on the basis of the following description which is given in correspondence with the annexed figures and as an illustrative example, without restricting the object of the invention. In the annexed figures.

DETAILED DESCRIPTION OF THE PREFERRED EMBODIMENTS

Figure 1:
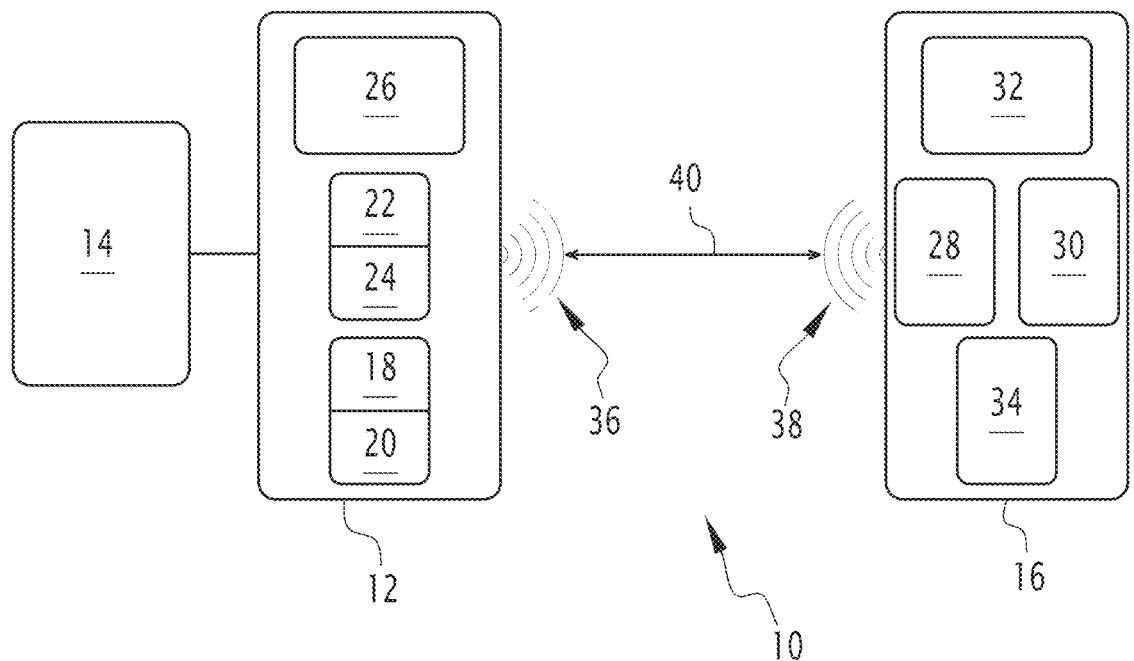
FIG. 1 is a schematic representation of a RFID system comprising an RFID antenna.

A RFID system 10 is illustrated on FIG. 1.

The RFID system 10 comprises a RFID reader 12, a controller 14 and a RFID tag 16.

In this RFID system 10, the RFID reader 12 and the controller 14 can be considered as active in so far as they are supplied with electric power.

By contrast, the RFID tag 16 is passive.

The RFID reader 12 is the main power source of the RFID system 10.

The RFID reader 12 interacts with the controller 14 to read/write and send control information to the RFID tag 16.

As a specific example, the controller 14 is here a smartphone system using an android/ios application for controlling the operating of the RFID reader 12.

In the example of FIG. 1, the RFID reader 12 comprises a signal generator 18, a transmitting antenna 20, a receiving antenna 22, an amplifier 24, and a processing unit 26.

The RFID tag 16 comprises a RFID antenna 28, a power unit 30, a memory 32 and a logic unit 34.

In operating, the signal generator 18 generates a UHF signal 36, which is transmitted by antenna 20 to RFID tag 16.

An UHF signal is a signal belonging to the UHF band, namely a signal with a frequency comprised between 860 MHz and 960 MHz.

The use of such frequency range greatly extends the distance at which the tagged object can be identified by RFID.

Each antenna disclosed in this specification are thus preferably designed to operate at frequencies belonging to a frequency domain extending from 860 MHz to 960 MHz.

This implies that each antenna has specific dimensions enabling to generate or detect signals with such frequency.

The UHF signal 36 transmitted from the RFID reader 12 carries a control signal which can be used to request data from the RFID tag 16.

The UHF signal 36 is captured by the RFID antenna 28, which provides power to the power unit 30 to energize the RFID tag 16.

The memory 32 comprises data, such as tag identification data.

The RFID tag 16 energized by the UHF signal 36, interprets said signal with logic unit 34 and if deemed appropriate by said logic unit 34 responds with a response signal 38.

In other words, the RFID tag 16 then uses the energy stored in the power unit 30 to respond with the requested data over the same path back to the RFID reader 12, hence the signal sent by the RFID tag 16 back to the RFID reader 12 is called the backscatter signal. The backscatter signal responds with the requested data on the same signal.

The response signal 38 is thus named the backscatter signal.

Such response signal 38 comprises tag identification data.

The response signal 38 is received by the receiving antenna 22.

The received signal is amplified by the amplifier 24.

The processing unit 26 interprets the amplified signal and sent the information to the controller 14 for use.

As apparent from this operating, backscatter signal 38 is the backbone of this RFID system 10 and enables passive RFID tag 16 to respond to a request for identification from a reader 12.

This operating assumes that the RFID tag 16 be able to communicate with the antennas 20 and 22 of the RFID reader 12.

For this, it implies that the RFID tag 16 be close to the RFID reader 12.

In other words, this implies that the reading distance 40 be as short as possible.

The reading distance 40 corresponds to the distance between the transmitting antenna 20 and the RFID antenna 28.

Such distance is fixed by the electromagnetic field produced by the RFID antenna 28. More precisely, the reading distance 40 has to be included in the reading range RR. The reading range RR comprises all the reading distance possible and corresponds to the distances at which the electromagnetic field produced by the RFID antenna 28 can be read by a RFID reader.

So as to improve reading, it is therefore desirable that the RFID antenna 28 be able to generate an electromagnetic field providing with an improved reading range RR.

Figure 2:
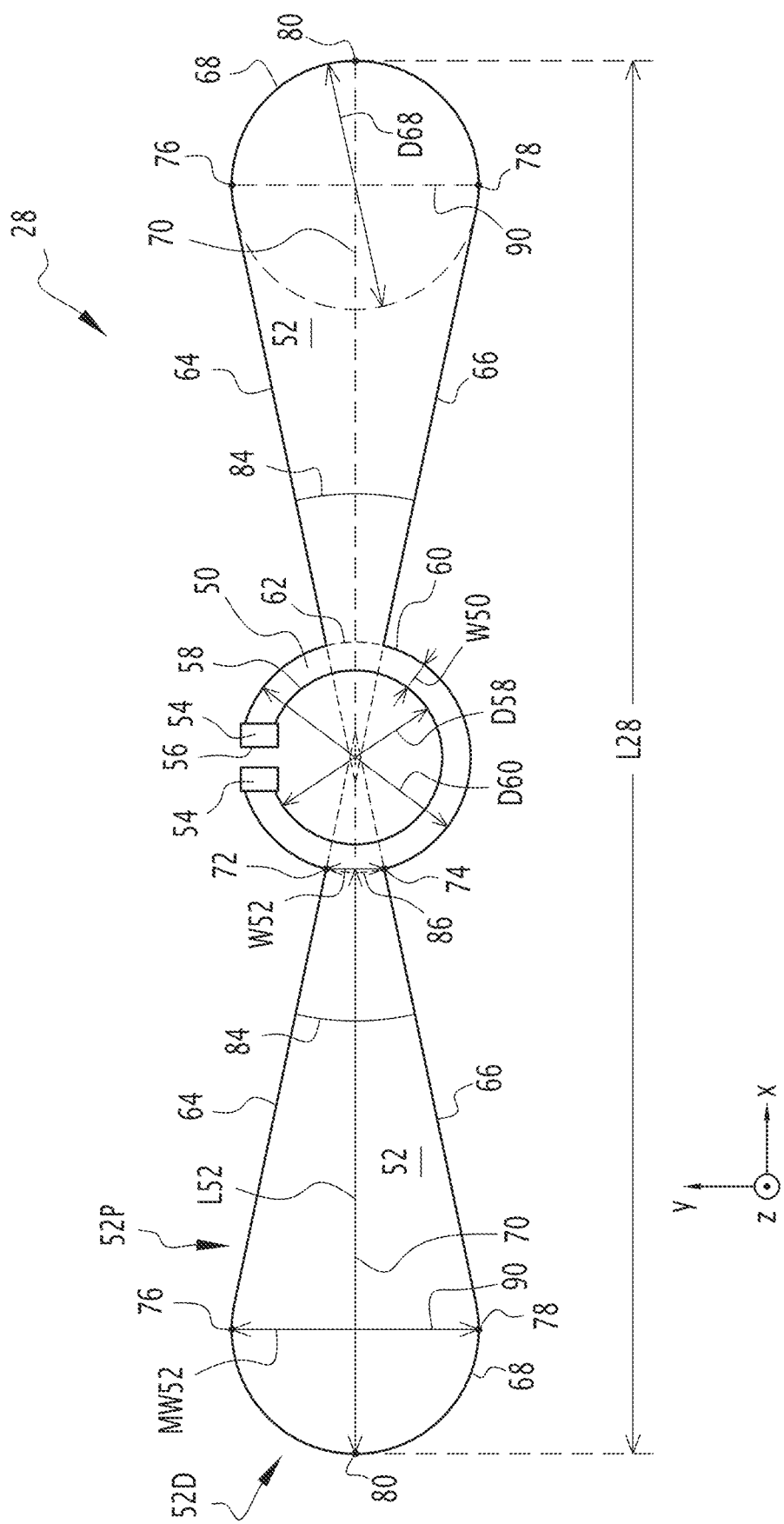
FIG. 2 is a schematic representation of an example of RFID antenna seen from above and providing with an improved reading range, the RFID antenna comprising a central inductive circuit and lobes.

An example of design of an RFID antenna 28 providing with such advantage is represented on FIG. 2.

The RFID antenna 28 extends mainly in a plane, which is perpendicular to the direction of propagation of the UHF signal 36 and the response signal 38.

This direction of propagation corresponds to a Z-axis in FIG. 2, so that the direction of propagation is named hereinafter direction of propagation Z.

Two transversal directions are also defined, a first transversal direction corresponding to an axis X (which is horizontal in the plane of FIG. 2) and a second transversal direction corresponding to an axis Y (which is vertical in the plane of FIG. 2).

Hereinafter, these transversal directions are respectively named first transversal direction X and second transversal direction Y.

The RFID antenna 28 comprises a central inductive circuit 50 (simply central circuit 50 hereinafter) and two lobes 52.

This example is non limitative in so far as other embodiments are considered, notably in reference to FIG. 3, 4, 6, 7 or 8.

The central circuit 50 is a conductive track extending between two extremities 54, the two extremities 54 being spatially separated.

The central circuit 50 is, for instance, made of a conductive metal, for example copper, aluminum, silver, gold and the like.

In the present example, the small space 56 between the extremities 54 confers a substantially annular shape to the central circuit 50.

This means that the central circuit 50 is comprised between an internal periphery 58 and an external periphery 60.

The internal periphery 58 and the external periphery 60 are, in the present example, concentric circles.

An internal diameter D58 and an external diameter D60 can here be defined as respectively the diameter of the internal periphery 58 and the diameter of the external periphery 60.

The internal diameter D58 is comprised between 8 mm (millimeters) and 30 mm.

The width W50 of the central circuit 50 is defined as the difference between the external diameter D60 and the internal diameter D58.

The width W50 of the central circuit 50 is more than 5 mm, preferably less than 10 mm.

The area A50 of the central circuit 50 is defined as the result of the area A60 of the external periphery 60 minus the area A58 of the internal periphery 58.

The area A50 of the central circuit 50 is less than 300 mm².

Preferably, the area A50 of the central circuit 50 is greater than 50 mm², preferably greater than 100 mm².

It can also be defined a first ratio R1 as the ratio of the area A50 of the central circuit 50 and the area A58 of the internal periphery 58.

The first ratio R1 is preferably comprised between 0.18 and 2.75.

Other geometries can be considered for the central circuit 50.

Figure 3:
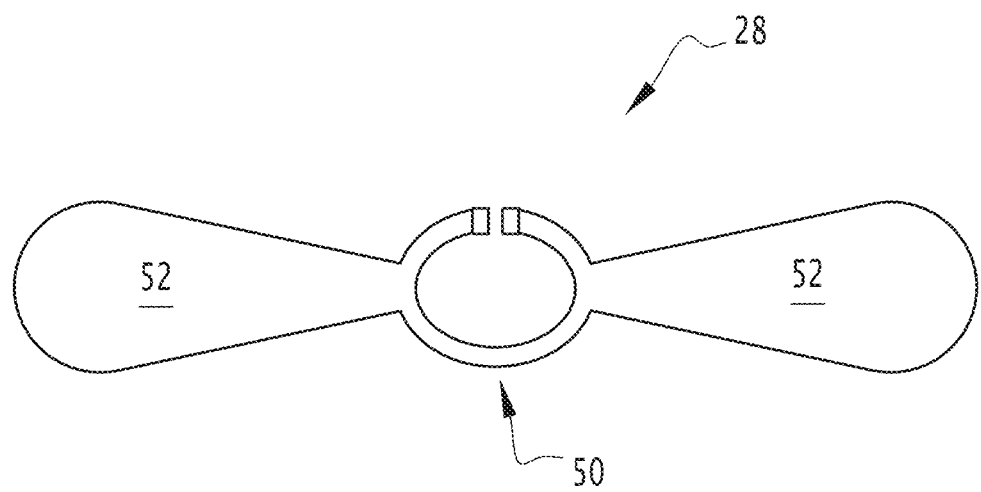
FIG. 3 is a schematic representation of another example of RFID antenna seen from above with another shape for the central inductive circuit.

Notably, it can be considered an oval shape as schematically represented on FIG. 3.

In such case, the internal periphery 58 becomes an internal ellipse and the external periphery 60 becomes an external ellipse.

The equivalent of the diameter is the combination of two distances: the major axis M58 (respectively M60) and a minor axis m58 (respectively m60).

In the representation of FIG. 3, the major axis M58 (respectively M60) extends along the first transversal direction X while the minor axis m58 (respectively m60) extends along the second transversal direction Y.

Figure 4:
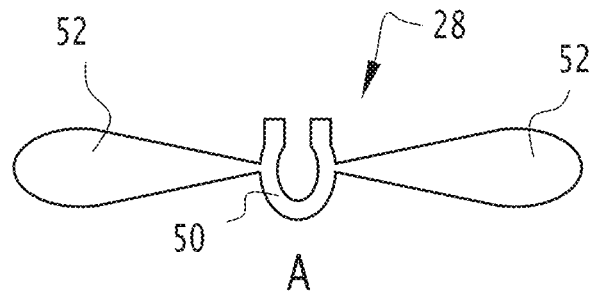
FIG. 4 is a schematic representation of several examples of RFID antennas seen from above with still other shapes for the central inductive circuit.
Figure 4:
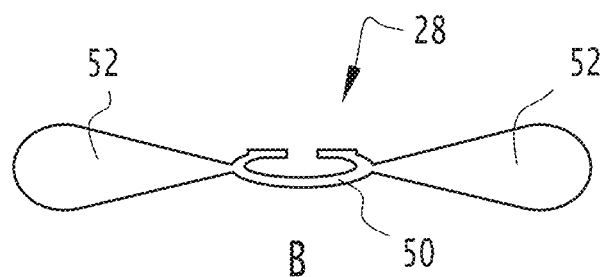
Figure 4:
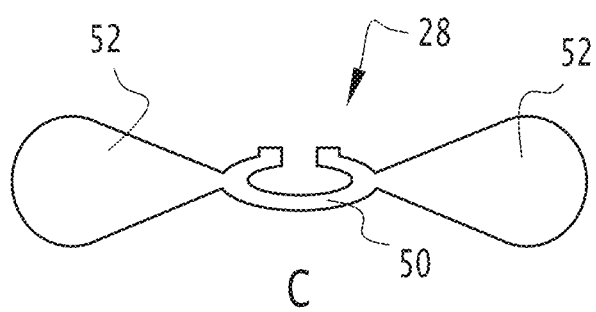
Figure 4:
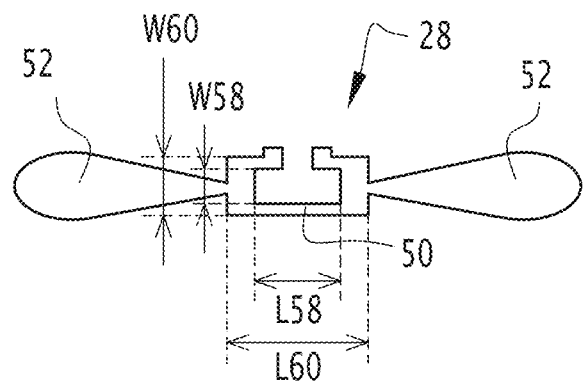

Other shapes corresponding to oval shape for the central circuit 50 are represented on the designs A to C of FIG. 4.

In these figures, design A is an elongated oval shape corresponding to a horseshoe-shape whereas, designs B to C are oval shapes with a larger interstice between the extremities.

It can also be considered a rectangular shape as schematically represented on the design D of FIG. 4.

In such case, the internal periphery 58 becomes an internal rectangle and the external periphery 60 becomes an external rectangle.

The equivalent of the diameter is the combination of two distances: the length L58 (respectively L60) and the width W58 (respectively W60) of the internal periphery 58 (respectively the external periphery 60).

In the representation of FIG. 2, the length L58 (respectively L60) extends along the first transversal direction X while the width W58 (respectively W60) extends along the second transversal direction Y.

More generally, it appears that the shape of the central circuit 50 is such that the central circuit 50 corresponds to a track with a space between two extremities and extending between an internal shape and an external shape.

Preferably, the internal shape and the external shape are the same and share the same center.

In addition, the shape is such that the width of the central circuit 50 be the same in each direction.

Reverting to FIG. 2, the extremities 54 have a non-limitative square shape and are spatially separated by a space with a rectangular shape.

The two lobes 52 are a circuit made of a conductive material, generally the same that is used for the central circuit 50.

The lobe 52 comprises a proximal part 52P and a distal part 52D.

An element is a lobe when the proximal part forms a truncated diverging element closed at one extremity by the distal part, the distal part being delimitated by a circle.

This confers to the lobe the shape of a flower petal, more specifically a daisy petal shape.

In the present case, the lobe is truncated because each lobe 52 extends from the external periphery 60 of the central circuit 50.

This implies that each lobe 52 extends between four edges, an extremal edge 62, a first proximal edge 64, a second proximal edge 66 and a distal edge 68.

The extremal edge 62 and the distal edge 68 are a portion of circle.

The extremal edge 62 is here concave while the distal edge 68 is convex.

In the present case, the first proximal edge 64 and the second proximal edge 66 are lines.

Furthermore, each lobe 52 extends along a symmetry axis 70.

The symmetry axis 70 is a radial direction with relation to the central circuit 50.

This implies that the first proximal edge 64 and the second proximal edge 66 are symmetrical with relation to the symmetry axis 70.

The symmetry axis 70 separates the distal edge 68 in two equal portions.

In addition, the first proximal edge 64, a second proximal edge 66 and a distal edge 68 form a continuous curve.

This means that, in each point of the curve formed by these edges 64, 66 and 68, the tangent to the curve is continuous. In other words, the tangent in each point of the curve has the same value on the left and on the right.

In particular, there is no point wherein the tangent abruptly changes its values, such as for an acute angle.

The edges 62, 64, 66 and 68 enable to define specific points for each lobe 52.

These specific points are:
- a first proximal extremity 72, which is the intersection between the external periphery 60 of the central circuit 50 and the first proximal edge 64,
- a second proximal extremity 74, which is the intersection between the external periphery 60 of the central circuit 50 and the second proximal edge 66,
- a first intermediate point 76, which is the intersection between the first proximal edge 64 and the distal edge 68,
- a second intermediate point 78, which is the intersection between the second proximal edge 66 and the distal edge 68, and
- a distal extremity 80, which is the middle of the distal edge 68 or the intersection between the distal edge 68 and the symmetry axis 70.

An apex 82 is also defined for each lobe 52, the apex 82 being defined as the intersection of the first proximal edge 64 and the second proximal edge 66.

Because the lobe is truncated in the case of FIG. 2, the apex 82 is shown by prolonging the first proximal edge 64 and the second proximal edge 66 with dotted lines.

With this representation, a diverging angle 84 can be defined for the lobe 52, the diverging angle 84 being the angle formed at the apex 82 between the first proximal edge 64 and the second proximal edge 66.

The diverging angle 84 is comprised between 0° and 25°, preferably comprised between 5° and 10°.

It can also be noticed that the apex 82 and the distal extremity 80 are aligned along the symmetry axis 70.

Based on these specific points, it can also be defined characteristic dimensions for the lobe 52, which are the length L52 of the lobe 52, the maximum width MW52 of the lobe 52 and the minimum width W52.

The length L52 is the extension of the lobe 52 along the symmetry axis 70, namely the maximum distance between the orthogonal projections of two points of the lobe 52 on the symmetry axis 70.

The length L52 is the distance between the distal extremity 80 and a proximal segment 86, the proximal segment 86 linking the first proximal extremity 72 and the second proximal extremity 74.

The length L52 is comprised between 25 mm and 50 mm.

The maximum width MW52 is the extension of the lobe 52 along an orthogonal axis perpendicular to the symmetry axis 70.

This orthogonal axis is here parallel to the second transversal direction Y.

The maximum width MW52 is the maximum distance between the orthogonal projections of two points of the lobe 52 on the orthogonal axis 88.

In the present case, the maximum width MW52 is the distance between the first intermediate point 76 and the second intermediate point 78. The maximum width MW52 is the length of an intermediate segment 90, the intermediate segment 90 linking the first intermediate point 76 and the second intermediate point 78.

The maximum width MW52 is comprised between 10 mm and 50 mm.

In the present example, the ratio AR between the maximum width MW52 of the lobe 52 and the length L52 of the lobe 52 is less than 2, more preferably less than 1 and most preferably less than 0.8.

The ratio AR between the maximum width MW52 of the lobe 52 and the length L52 of the lobe 52 is labelled AR because this ratio corresponds to the aspect ratio of the lobe 52.

Hereinafter, such value is named aspect ratio AR of the lobe 52.

The aspect ratio AR is greater than 0.25.

The minimum width W52 is the length of the proximal segment 86.

In the present example, both the proximal segment 86 and the intermediate segment 90 are parallel to the second transversal direction Y.

The proximal part 52P therefore diverges from the minimum width W52 to the maximum width MW52 when following the proximal part 52P from the proximal segment 86 to the intermediate segment 90.

The minimum width W52 is greater than 0.1 mm, preferably greater than 0.5 mm.

According to the example of FIG. 2, the distal edge 68 is a half circle.

The diameter of the distal edge 68, which corresponds to the diameter of such half circle, is named D68 hereinafter.

The diameter D68 of the distal edge 68 is comprised between 5 mm and 45 mm, preferably between 10 mm and 30 mm.

In the case of FIG. 2, both lobes 52 have here the same shape.

In addition, the lobes 52 constitute a pair.

In the present description, two lobes 52 form a pair when their symmetry axis 70 are aligned (along the first transversal direction X for FIG. 2).

This implies that the RFID antenna 28 is symmetrical with relation to the second transversal direction Y.

In addition, the RFID antenna 28 of the embodiment of FIG. 2 is also symmetrical with relation to the first transversal direction X.

The length L28 of the RFID antenna 28 is defined as the largest distance between two points of the RFID antenna 28 along the main direction.

In the present case, the length of the RFID antenna 28 is the sum of the length of the central circuit 50 and twice the length of the lobes 52.

The length L28 of the RFID antenna 28 is greater than 40 mm.

Preferably, the length L28 of the RFID antenna 28 is comprised between 80 mm and 120 mm.

In variant or in complement, the length L28 of the RFID antenna 28 is a fraction of the UHF wavelength of the UHF signal 36.

More preferably, the fraction is equal to ¼ with a margin of 1% (resulting in a length comprised between 80 mm and 100 mm) or to ½ with the same margin (resulting in a length comprised between 160 mm and 200 mm).

Figure 5:
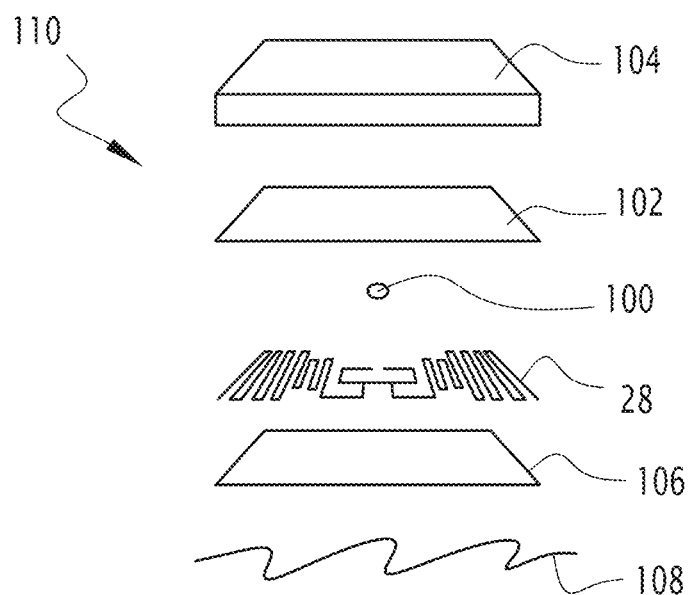
FIG. 5 is a schematic representation of the different layers of a tag.

Such RFID antenna 28 is part of a RFID tag, as visible on FIG. 5.

Figure 6:
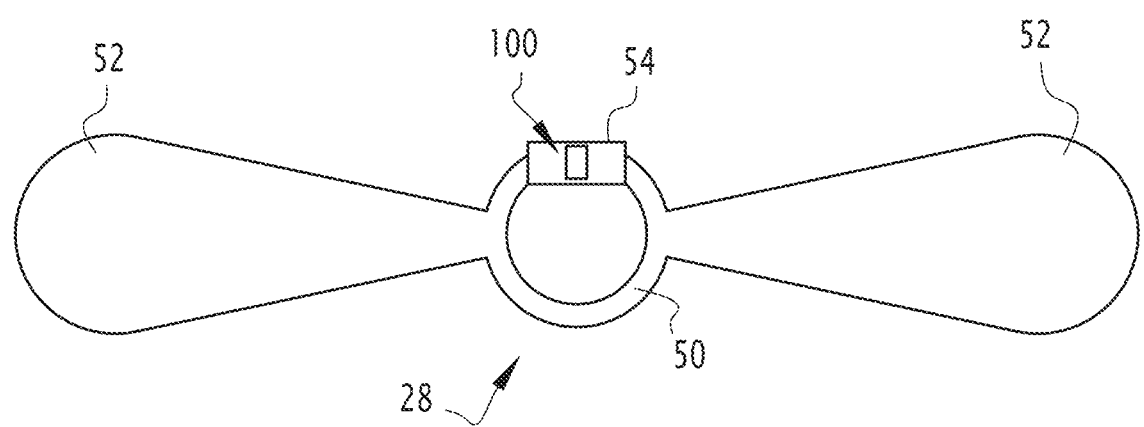
FIG. 6 is a schematic representation of an example of RFID antenna provided with a chip.

More precisely, it is the RFID antenna 28 provided with a RFID chip 100, as visible on FIG. 6, which is one layer of the RFID tag of FIG. 5.

The RFID chip 100 is here a Higg chip or strap, which is attached to the extremities 54.

Such RFID antenna 28 is meant to be embedded in a RFID tag.

An example of the different layers 28, 100, 102, 104, 106 and 108 of such a RFID tag 110 is schematically represented on FIG. 5.

Above the RFID antenna 28, one can find the RFID chip 100, the face (layer 102) and the encasement (layer 104) if applicable.

Below the RFID antenna 28, one can find the substrate (layer 106) and the adhesive (layer 108) if applicable.

The layers of the RFID tag 110 will in practice depend upon the method of manufacturing the RFID antenna 28.

Manufacturing the RFID tag can be achieved by several techniques, which are easily accessible to the person skilled in the art.

According to a first example of techniques, the method for manufacturing the RFID antenna 28 comprises a step of forming the RFID antenna 28 by using a conductive metal transfer printing.

According to a second example of technique, the method for manufacturing the RFID antenna 28 comprises a step of forming the RFID antenna 28 by using a conductive inkjet printing.

According to a third example of technique, the method for manufacturing the RFID antenna 28 comprises a step of forming the RFID antenna 28 by using a conductive screen printing.

According to a fourth example of technique, the method for manufacturing the antenna comprises a step of cutting the RFID antenna 28 from a metal foil and a step of adhesively attach the antenna to the substrate According to the fifth example of technique, the method for manufacturing the RFID antenna 28 comprises a step of providing a substrate metallized with a continuous layer of metal and a step of forming the antenna by removing metal from the substrate outside of the areas devoted to form the RFID antenna 28.

Such removing can be carried out by using a chemical technique or mechanical etching.

Based on this method for manufacturing, an RFID tag can be produced, for instance, by printing an electrically conductive antenna directly on packaging substrate materials and mounting a chip on the printed antenna.

This enables an RFID tag 110 to be incorporated into a packaged item by affixing said tag to the packaging substrate used to encase the item.

Such RFID tag 110 has the specific feature of having a RFID antenna 28 with a special design.

As shown in the experimental section, such design of the RFID antenna 28 enables to obtain an improved reading range RR.

The design also enables to obtain a better impedance adaptation.

Furthermore, such improvement in the behavior of the associated RFID tag is obtained with existing methods of manufacturing RFID tags.

Such method for manufacturing is also compatible with other embodiments of the antenna, which may be considered, and notably embodiments with more lobe pairs.

Figure 7:
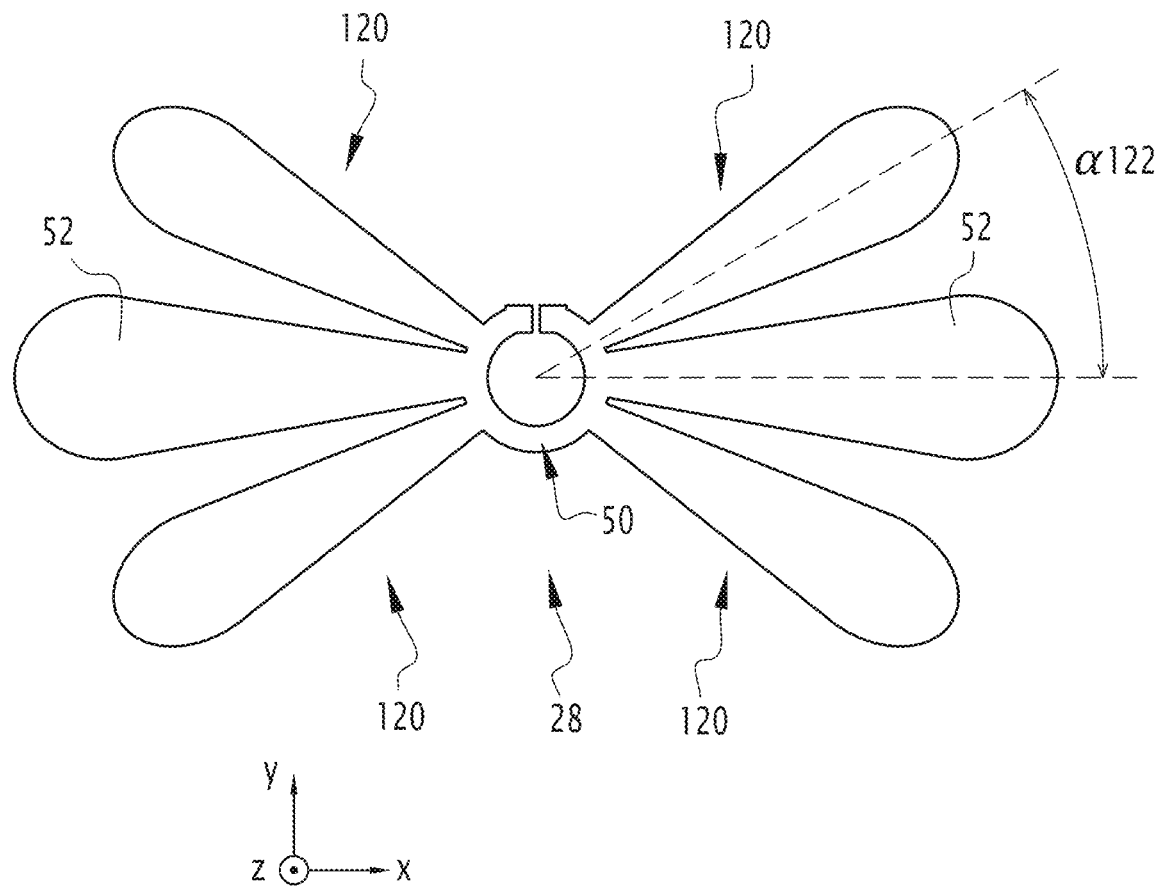
FIG. 7 is a schematic representation of another example of RFID antenna seen from above.

FIG. 7 illustrates another example of design of RFID antenna 28.

So as to avoid repeating the same elements, only the differences between the example of FIG. 2 are given below.

In the case of FIG. 7, the antenna 28 comprises three lobe pairs instead of one lobe pair as for the example of FIG. 2.

This means that the antenna comprises the lobe pair 52 of FIG. 2 and additional lobe pairs 120.

The lobe of the additional pairs 120 of lobes corresponds to side lobes 120 while the lobes already present in the case of FIG. 2 corresponds to primary lobes 52.

In the present case, the antenna 28 comprises four side lobes 120 and two primary lobes 52.

The design of the RFID antenna 28 remains symmetrical with relation to the first transversal direction X and the second transversal direction Y.

This implies that each primary lobe 52 is intercalated between two side lobes 120.

An inter-lobe angle α122 between the side lobes 120 and the primary lobe 52 can be defined.

This inter-lobe angle α122 is less than 90°, preferably less than 60°.

In addition, the dimensions of the side lobes 120 are smaller than the dimensions of the primary lobe 52. This applies to either the length or the width (maximum one) of the side lobe 120.

Figure 8:
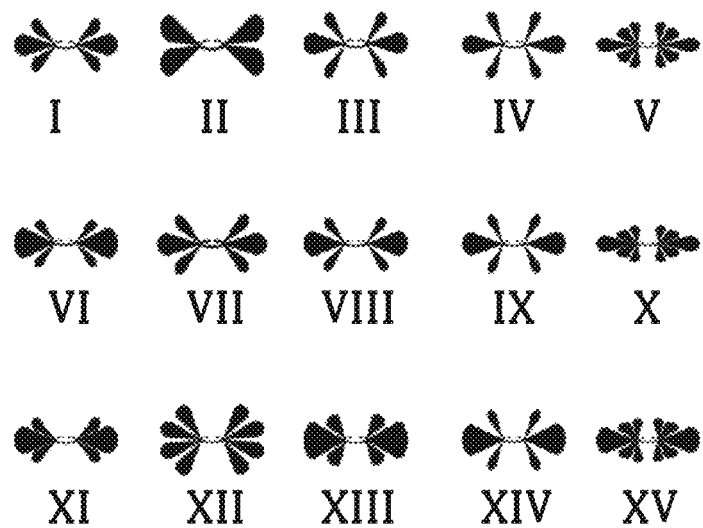
FIG. 8 is a schematic representation of 15 other examples of RFID antennas seen from above.

FIG. 8 illustrates schematically fifteen other examples of antenna designs, which are labelled with a Latin number from I to XV.

In this case of FIG. 8, each antenna I to XV comprises at least three lobe pairs instead of one lobe pair as for the example of FIG. 2.

All these examples share the same antenna length, which is set here to be equal to 100 mm. This enables to compare in an easier way these examples.

These antennae differ by their number of lobe pairs, the width of the primary lobe and the inter-lobe angle, as appears from the present table:

TABLE 1

Some features of the antenna designs according to the designs I to XV of FIG. 8

| Example of antenna | Number of lobe pairs | Width of the primary lobe (mm) | Inter-lobe angle (°) |
|---|---|---|---|
| I | 3 | 10 | 30 |
| II | 2 | 15 | 35 |
| III | 3 | 10 | 45 |
| IV | 3 | 10 | 60 |

TABLE 1-continued

Some features of the antenna designs according to the designs I to XV of FIG. 8

| Example of antenna | Number of lobe pairs | Width of the primary lobe (mm) | Inter-lobe angle (°) |
|---|---|---|---|
| V | 5 | 10 | 30 |
| VI | 3 | 15 | 30 |
| VII | 3 | 10 | 35 |
| VIII | 3 | 15 | 45 |
| IX | 3 | 15 | 60 |
| X | 5 | 15 | 30 |
| XI | 3 | 20 | 30 |
| XII | 4 | 15 | 30 |
| XIII | 3 | 20 | 45 |
| XIV | 3 | 20 | 60 |
| XV | 5 | 20 | 30 |

As apparent from the experimental section, such design of antenna also provides an RFID tag with an improved reading range.

EXPERIMENTAL SECTION

Several experiments were carried out by the Applicant and are now described.

Hereinafter, unless otherwise specified, all parts are by weight, and all temperatures are in degrees Celsius.

Experiment 1—Performance of Comparative Examples

Figure 9:
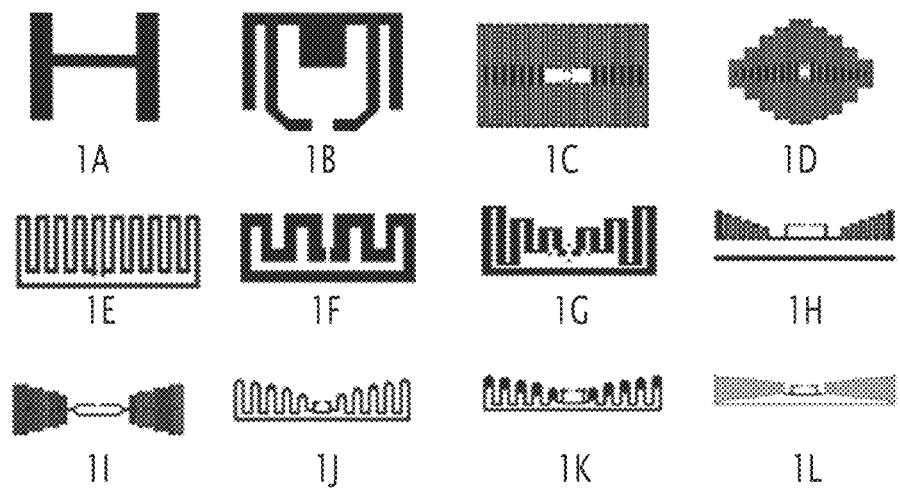
FIG. 9 is a schematic representation of twelve examples of RFID antennas according to the prior art.

Using a Zebra ZT610 300 dpi thermal transfer printer obtained from Zebra Technologies Corporation of Lincolnshire, Illinois, the RFID antenna designs depicted in FIG. 9 were printed onto 4" wide TRANSFERGLOSS PLUS RP51 40 #WHITE KRAFT paper label stock obtained from Raflatec Corporation of Mills River, North Carolina, using a Metallograph® conductive thermal transfer ribbon obtained from Armor-IIMAK Corporation of Amherst, New York. The conductive thermal transfer process, using the Metallograph® ribbon deposited a 0.245 micron thick conductive aluminum antenna onto the Transfergloss paper stock. The printing speed on the ZT610 was 2 inches per second and the print energy was set to 28. Once printed, the conductive antenna was ready for use on the RFID tag.

A Higgs-3 RFID Strap, supplied by Alien Technologies of San Jose, California, was attached to each of the printed RFID antenna of FIG. 9. The Higgs-3 RFID chip is a highly integrated, 800-bit memory, single chip UHF RFID Tag IC. The chip conforms to the EPC global Class 1 Gen 2 specifications. Two part silver conductive epoxy adhesive number 8330D-19G 8330D supplied by MG Chemicals of Burlington, Ontario, Canada was used to attach a Higgs 3 RFID chip mounted strap to the antenna. Equal parts of the silver epoxy adhesive and initiator were dispensed on a clean surface and mixed with a wooden stick for 30 seconds so that the mixture was smooth and homogeneous. Using the wooden stick, a 3 mm×3 mm coating of the mixed adhesive was applied to each leg of the chip box on the printed RFID antenna. The Higgs 3 RFID strap was then picked up using a vacuum pen and mounted onto the antennae such that the mounting pads on the Higgs RFID strap were aligned with the conductive epoxy applied to the antenna. The antenna with mounted Higgs RFID straps were placed in a heat press set to 260° C. and pressed for 45 minutes. The antennae and straps were then removed from the heat press and allowed to cool for a minimum of 4 hours after which the straps were found to be well bonded to the antennae, which could then be flexed without the strap coming away.

Impedance of a printed antenna were measured using the method described by the article "Impedance measurement for balanced UHF RFID tag antennas," Hailong Zu, Y. C. Andrew Ko and Terry T. Ye, 2010 IEEE Radio and Wireless Symposium (RWS), New Orleans, LA, USA.

Figure 10:
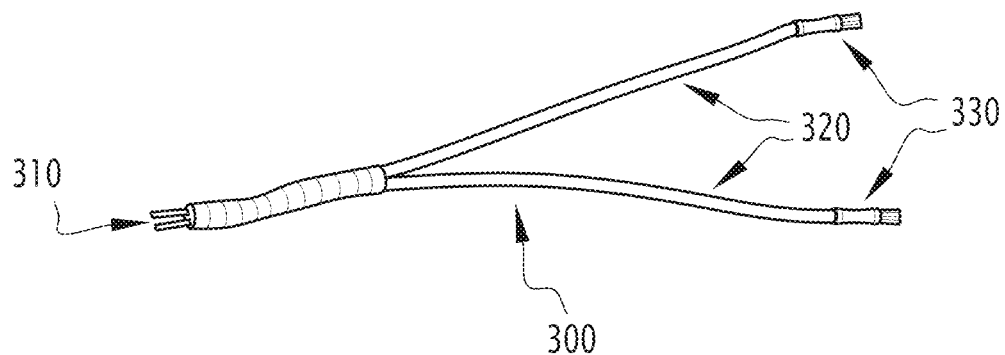
FIG. 10 is a schematic representation of a custom probe.

This method utilized a Vector Network Analyzer (VNA) and a custom probe (FIG. 10). The probe is designed in a manner that can be electrically connected to the antenna with spring loaded connectors 300 to measure the impedance experienced by chip. The signal from the connectors 310 travel through coaxially cables 320 to connectors 330 which connect the probe to the VNA. The VNA is calibrated to simulate chip being attached to read the approximate impedance. To calibrate a VNA, a custom load of 50 ohms is used.

Measurements of the reading range of a given RFID tag were conducted in the large open space of a building with concrete wall construction using a TURCK U Grok UHF RFID reader supplied by TURCK of Minneapolis, Minnesota. The reader, which operates in the range of 865-928 MHz, is optimum for the frequency requirement of 915 MHz. The orientation of the reader and the tag can have a significant impact on the measurement of reading range as the reader's antenna is directional.

Figure 11:
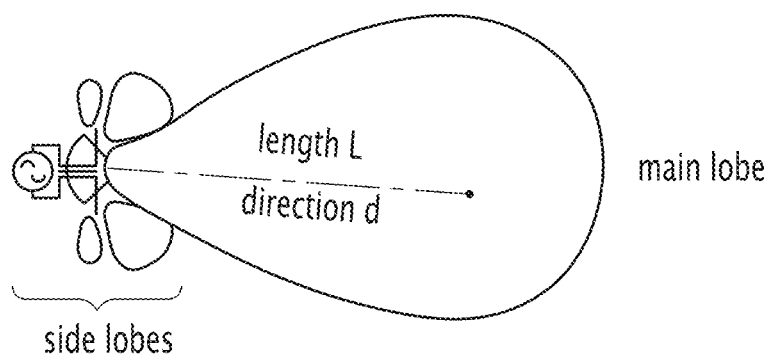
FIG. 11 is a schematic representation of the field of a RFID reader.

FIG. 11 depicts the directional radiation pattern of an RFID reader antenna. Maximum read distance L can be achieved when the RFID tag is placed along the beam direction d. Consecutive measurements are made, using a measuring tape between the reader and the RFID tag, until the reader is no longer able to read the tag.

Additionally, the symmetry axis 70 of the RFID antenna tag should be perpendicular to the beam direction d of the RFID reader for measurements of reading range RR.

The farthest distance in which the reader can read the tag is defined as the reading range RR of the RFID tag.

Reading range RR measurements were made with tags produced using the comparison antenna designs depicted in FIG. 9.

The experimental results are given in table 2, together with the length of the antenna (dimension of the antenna along the first transversal direction X) and the height of the antenna (dimension of the antenna along the second transversal direction Y).

TABLE 2

Performances of the antenna designs 1A to 1L

| Comparative exemple | Name of the antenna design | Z (Ohm) | Antenna Length (mm) | Antenna Height (mm) | RR (m) |
|---|---|---|---|---|---|
| 1A | H skeleton | 63.6-12.6 j | 80 | 60 | 0 |
| 1B | Dessymm | 59.0-7.8 j | 80 | 60 | 0 |
| 1C | SymmXY | 55.6-6.9 j | 80 | 50 | 0.4 |
| 1D | Symmspi | 53.5-9.7 j | 80 | 50 | 0.6 |
| 1E | Symmsploop | 52.5-3.5 j | 80 | 30 | 0.7 |
| 1F | SymmspX | 48.8-12.8 j | 80 | 30 | 0.9 |
| 1G | SymmCurrdist | 50.9-3.4 j | 80 | 30 | 1.5 |
| 1H | Symcommy | 50.6-5.1 j | 80 | 30 | 1.75 |
| 1I | Symcommxy | 49.6-50.7 j | 80 | 40 | 1.5 |
| 1J | Squiggle-1 | 48.6-3.1 j | 100 | 15 | 1.6 |
| 1K | Squiggle-2 | 49.8-3.1 j | 100 | 15 | 2.3 |
| 1L | Squiggle-3 | 48.3-7.8 j | 100 | 15 | 1.7 |

Z: impedance of the antenna

As can be seen in Table 2, the reading ranges of these comparative RFID antenna designs vary from 0 m to 2 m.

Many of the comparative antenna designs 1A to 1L do not match the impedance of the Higgs chip used in these tags which is 50-0j.

Comparative example 1I Symcommy and 1K Squiggle-2 designs have the closest impedance match and shows only modest reading ranges.

Experiment 2—Examples According to FIG. 6

Several variations named 2A to 2Y of the RFID antenna 28 having the design shown in FIG. 6 were printed and mounted with RFID chips in an analogous fashion to those of the examples 1A to 1L. Reading range RR and impedance measurements on these examples 2A to 2Y were also made in an analogous fashion to those of the examples 1A to 1L.

The results can be found in table 3.

Examples 2A to 2Y all have a central circuit 50 to which a Higgs 3 chip/strap was attached as well as two antenna lobes, as depicted in FIG. 6. Unexpectedly, both the area of the central circuit 50 and the lobes which extend from the central circuit 50 have been found to contribute to the reading range RR of the RFID tag.

As can be seen in Table 3, for antenna with measured impedance near 50-0j, RFID tags with larger inductive circuit areas show greater reading range.

It has also been discovered that the width of the lobe and the length of the lobe also strongly influence the reading range. Smaller ratios of the width of the lobe and the length of the lobe (aspect ratio AR), contribute to greater the reading range RR.

When comparing examples 2R to 2Y, it appears that the only varying parameter is the value of the minimum width W52. The tested values are respectively 4 mm, 3 mm, 2.5 mm, 2 mm, 1.5 mm, 1 mm and 0.5 mm.

The value of 2.5 mm (corresponding to example 2T) for the minimum width W52 appears to provide with the largest reading range RR, namely 16.3 m. Indeed, as the minimum width W52 decreases from 2.5 mm to 0.5 mm (examples 2T to 2X), the reading range RR decreases from 16.3 m to 7 m. Similarly, as the minimum width W52 increases from 2.5 mm to 4 mm (examples 2R to 2T), the reading range RR decreases from 16.3 m to 10 m.

It can also be pointed out that, regardless of the value of the minimum width W52, all the RFID tags of these examples 2R to 2Y exhibits greater reading range (when compared to examples 1A to 1L).

Example 2Y is to be compared with example 2T.

For example 2T, the antenna was comprised of aluminum with a thickness of 0.245 micron whereas the antenna of example 2Y was prepared using a 50 micron thick Aluminum foil tape, Electrically Conductive Aluminum Tape 3302 supplied by 3M of St. Paul, MN 55144-1000.

No significant difference in reading range between example 2T and example 2Y was observed, meaning that the thickness of the aluminum used to prepare the antenna did not factor into its performance over the range of 0.245 microns to 50 microns.

TABLE 3

Performances of the antenna designs 2A to 2Y

| Example | L28 (mm) | MW52 (mm) | L52 (mm) | D58 (mm) | D60 (mm) | W52 (mm) | A50 (mm$^2$) | AR | Z28 (Ω) | RR (m) |
|---|---|---|---|---|---|---|---|---|---|---|
| 2A | 80 | 50 | 27.5 | 15 | 25 | 5 | 157.0 | 1.818 | 50 − 4j | 5.0 |
| 2B | 80 | 30 | 27.5 | 15 | 25 | 5 | 157.0 | 1.091 | 50 − 4j | 7.0 |
| 2C | 80 | 10 | 27.5 | 15 | 25 | 5 | 157.0 | 0.364 | 50 − 4j | 12.5 |
| 2D | 100 | 15 | 45.6 | 8 | 8.8 | 0.4 | 5.3 | 0.329 | 64 − 7j | 3.4 |
| 2E | 100 | 15 | 45 | 8 | 10 | 1 | 14.1 | 0.333 | 53.6 − 3.8j | 5.0 |
| 2F | 100 | 15 | 44 | 8 | 12 | 2 | 31.4 | 0.341 | 49.2 − 3j | 4.6 |
| 2G | 100 | 15 | 43 | 8 | 14 | 3 | 51.8 | 0.349 | 49.6 − 3j | 7.0 |
| 2H | 100 | 15 | 41 | 12 | 18 | 3 | 70.7 | 0.366 | 52 − 2j | 6.0 |
| 2I | 100 | 15 | 41 | 10 | 18 | 4 | 87.9 | 0.366 | 49 − 8.1j | 10.0 |
| 2J | 100 | 15 | 41 | 8 | 18 | 5 | 102.1 | 0.366 | 51 − 1.1j | 4.5 |
| 2K | 100 | 15 | 32.5 | 30 | 35 | 2 | 70.7 | 0.462 | 55 + 7j | 7.0 |
| 2L | 100 | 15 | 32.5 | 25 | 35 | 7.5 | 304.2 | 0.462 | 53 − 7j | 5.0 |
| 2M | 100 | 15 | 37.5 | 15 | 25 | 2 | 70.7 | 0.400 | 49.7 − 18j | 8.8 |
| 2N | 100 | 15 | 30 | 20 | 40 | 10 | 471.0 | 0.500 | 64 − 8.6j | 3.0 |
| 2O | 100 | 30 | 37.5 | 15 | 25 | 5 | 157.0 | 0.800 | 50 − 4j | 7.5 |
| 2P | 100 | 10 | 37.5 | 15 | 25 | 5 | 157.0 | 0.267 | 50 − 4j | 14.0 |
| 2Q | 100 | 20 | 37.5 | 15 | 25 | 5 | 157.0 | 0.533 | 50 − 4j | 11.0 |
| 2R | 100 | 15 | 37.5 | 15 | 25 | 4 | 157.0 | 0.400 | 51 + 22j | 10 |
| 2S | 100 | 15 | 37.5 | 15 | 25 | 3 | 157.0 | 0.400 | 50 − 0.6j | 12.5 |
| 2T | 100 | 15 | 37.5 | 15 | 25 | 2.5 | 157.0 | 0.400 | 50 − 4j | 16.3 |
| 2U | 100 | 15 | 37.5 | 15 | 25 | 2 | 157.0 | 0.400 | 50 − 4j | 14.7 |
| 2V | 100 | 15 | 37.5 | 15 | 25 | 1.5 | 157.0 | 0.400 | 51 − 3j | 11.5 |
| 2W | 100 | 15 | 37.5 | 15 | 25 | 1 | 157.0 | 0.400 | 50 + 17j | 12 |
| 2X | 100 | 15 | 37.5 | 15 | 25 | 0.5 | 157.0 | 0.400 | 54 − 6j | 7 |
| 2Y | 100 | 15 | 37.5 | 15 | 25 | 2.5 | 157.0 | 0.400 | 50 − 4j | 16.3 |

Z28: impedance of the RFID antenna 28

Experiment 3—Examples According to FIG. 3

Variations of the inventive RFID antenna 28 design, depicted in FIG. 3 were printed and mounted with RFID chips in an analogous fashion to those of the examples 1A to 1L.

Examples 3A to 3AQ all had an antenna length of 100 mm, a primary lobe width of 15 mm and variations of the dimensions of the central circuit 50.

As noted in Table 1, comparative RFID tags were shown to have a reading range of 2.3 meters or less. RFID tag Examples 3A to 3AQ were measured to have reading ranges from 3 meters to 16.3 meters.

Analysis of the data in Table 4 shows that several dimensional characteristics of the RFID antenna 2/8 according to examples 3A to 3AQ contribute to obtaining reading ranges above 4.5 meters.

In particular, for antennae with an internal diameter D58 greater than 8 mm and less than or equal to 30 mm and difference in diameter between the external periphery 60 and internal periphery 58 of said central circuit 50 preferably greater than 5.0 mm, greater reading range performance was observed.

For antenna with an area A50 of the central circuit 50 less than 300 mm$^2$, greater reading range RR performance was observed.

For antenna whose ratio of the area A50 of the central circuit 50 and the area A58 of the internal periphery 58, R1, is between 0.18 and 2.75, greater reading range RR performance was observed.

TABLE 4

Performances of the antenna designs 3A to 3AQ

| Example | D58 (mm) | D60 (mm) | AR | D60 − D58 | m58 | M58 | A50 (mm$^2$) | A58 (mm$^2$) | R1 = A50/A58 | Z (Ω) | RR (m) |
|---|---|---|---|---|---|---|---|---|---|---|---|
| 3A | 20 | 40 | 0.50 | 20.00 | 10 | 20 | 471.00 | 157.00 | 3.00 | 64 − 8.6j | 3 |
| 3B | 8 | 8.8 | 0.33 | 0.80 | 4 | 4.4 | 5.28 | 25.12 | 0.21 | 64 − 7j | 3.4 |
| 3C | 7 | 12 | 0.34 | 5.00 | 3.5 | 6 | 37.29 | 19.23 | 1.94 | 58 − 3.2j | 3.8 |
| 3D | 7 | 10 | 0.33 | 3.00 | 3.5 | 5 | 20.02 | 19.23 | 1.04 | 48.2 − 6j | 4.2 |
| 3E | 8 | 18 | 0.37 | 10.00 | 4 | 9 | 102.05 | 25.12 | 4.06 | 48 − 12j | 4.5 |
| 3F | 8 | 18 | 0.37 | 10.00 | 4 | 9 | 102.05 | 25.12 | 4.06 | 48 − 12j | 4.5 |
| 3G | 19 | 20 | 0.38 | 1.00 | 9 | 10 | 22.77 | 134.24 | 0.17 | 56 − 122j | 4.5 |
| 3H | 7.5 | 12 | 0.34 | 4.50 | 3.7 | 6 | 34.74 | 21.78 | 1.59 | 48.7 − 127j | 4.6 |
| 3I | 8 | 12 | 0.34 | 4.00 | 4 | 6 | 31.40 | 25.12 | 1.25 | 49.2 + 13j | 4.6 |
| 3J | 7 | 15 | 0.35 | 8.00 | 3.5 | 7 | 63.19 | 19.23 | 3.29 | 47.4 − 7j | 4.6 |
| 3K | 8 | 12 | 0.34 | 4.00 | 4 | 6 | 31.40 | 25.12 | 1.25 | 49.2 − 3j | 4.6 |
| 3L | 8.5 | 10 | 0.33 | 1.50 | 4 | 6 | 20.41 | 26.69 | 0.76 | 52.8 − 3j | 4.8 |

TABLE 4-continued

Performances of the antenna designs 3A to 3AQ

| Example | D58 (mm) | D60 (mm) | AR | D60 − D58 | m58 | M58 | A50 (mm²) | A58 (mm²) | R1 = A50/A58 | Z (Ω) | RR (m) |
|---|---|---|---|---|---|---|---|---|---|---|---|
| 3M | 8 | 10 | 0.33 | 2.00 | 4 | 6 | 21.98 | 25.12 | 0.88 | 51.8 − 24j | 5 |
| 3N | 8.5 | 12 | 0.34 | 3.50 | 4 | 6 | 29.83 | 26.69 | 1.12 | 52 − 9j | 5 |
| 3O | 8 | 10 | 0.33 | 2.00 | 4 | 5 | 14.13 | 25.12 | 0.56 | 53.6 − 3.8j | 5 |
| 3P | 25 | 35 | 0.46 | 10.00 | 12.5 | 20 | 304.19 | 245.31 | 1.24 | 53 − 7j | 5 |
| 3Q | 7.5 | 10 | 0.33 | 2.50 | 3.7 | 5 | 17.47 | 21.78 | 0.80 | 52 − 17j | 5.1 |
| 3R | 7.5 | 15 | 0.35 | 7.50 | 3.7 | 7 | 60.64 | 21.78 | 2.78 | 52 + 35j | 5.2 |
| 3S | 9 | 11 | 0.34 | 2.00 | 4 | 6 | 23.55 | 28.26 | 0.83 | 49 − 2j | 5.6 |
| 3T | 12 | 18 | 0.37 | 6.00 | 6 | 9 | 70.65 | 56.52 | 1.25 | 52 − 2j | 6 |
| 3U | 18 | 20 | 0.38 | 2.00 | 9 | 10 | 29.83 | 127.17 | 0.23 | 56 − 94j | 6 |
| 3V | 9 | 12 | 0.34 | 3.00 | 4 | 6 | 28.26 | 28.26 | 1.00 | 51 + 61j | 6.8 |
| 3W | 9.5 | 11 | 0.34 | 1.50 | 4.5 | 6 | 18.25 | 33.56 | 0.54 | 50 + 132j | 7 |
| 3X | 8 | 15 | 0.35 | 7.00 | 4 | 7 | 57.31 | 25.12 | 2.28 | 51 − 2J | 7 |
| 3Y | 8 | 14 | 0.35 | 6.00 | 4 | 7 | 51.81 | 25.12 | 2.06 | 49.6 − 3J | 7 |
| 3Z | 30 | 35 | 0.46 | 5.00 | 4 | 6 | 70.65 | 94.20 | 0.75 | 55 + 7j | 7 |
| 3AA | 8.5 | 15 | 0.35 | 6.50 | 4 | 7 | 55.74 | 26.69 | 2.09 | 51 − 2j | 7.3 |
| 3AB | 17 | 20 | 0.38 | 3.00 | 8 | 10 | 50.24 | 106.76 | 0.47 | 52 − 36j | 8 |
| 3AC | 9.5 | 12 | 0.34 | 2.50 | 4.5 | 6 | 22.96 | 33.56 | 0.68 | 49 − 19j | 8.5 |
| 3AD | 15 | 25 | 0.40 | 10.00 | 4 | 6 | 70.65 | 47.10 | 1.50 | 49.7 − 18j | 8.8 |
| 3AE | 9 | 15 | 0.35 | 6.00 | 4 | 7 | 54.17 | 28.26 | 1.92 | 49.4 + 3j | 9 |
| 3AF | 9.5 | 15 | 0.35 | 5.50 | 4.5 | 7 | 48.87 | 33.56 | 1.46 | 50 + 64j | 9 |
| 3AG | 10 | 18 | 0.37 | 8.00 | 5 | 9 | 87.92 | 39.25 | 2.24 | 49.8 − 1j | 10 |
| 3AH | 16 | 20 | 0.38 | 4.00 | 8 | 10 | 56.52 | 100.48 | 0.56 | 48 − 12J | 10 |
| 3AI | 18 | 25 | 0.40 | 7.00 | 4 | 6 | 61.23 | 56.52 | 1.08 | 48 − 19J | 10 |
| 3AJ | 19 | 25 | 0.40 | 6.00 | 4 | 6 | 58.09 | 59.66 | 0.97 | 48 − 12J | 10 |
| 3AK | 19 | 29 | 0.42 | 10.00 | 9 | 14 | 184.48 | 134.24 | 1.37 | 49 − 17J | 12 |
| 3AL | 17 | 27 | 0.41 | 10.00 | 8 | 13 | 168.78 | 106.76 | 1.58 | 51 − 0.002J | 12.8 |
| 3AM | 18 | 28 | 0.42 | 10.00 | 9 | 14 | 180.55 | 127.17 | 1.42 | 51 − 0.1J | 13 |
| 3AN | 16 | 25 | 0.40 | 9.00 | 4 | 6 | 67.51 | 50.24 | 1.34 | 51 − 8J | 14 |
| 3AO | 17 | 25 | 0.40 | 8.00 | 4 | 6 | 64.37 | 53.38 | 1.21 | 50 − 62J | 14 |
| 3AP | 16 | 26 | 0.41 | 10.00 | 8 | 13 | 164.85 | 100.48 | 1.64 | 50 − 30J | 15 |
| 3AQ | 15 | 25 | 0.40 | 10.00 | 7.5 | 12.5 | 157.00 | 88.31 | 1.78 | 50 − 4J | 16.3 |

Experiment 4—Examples According to FIG. 4

Variations of the inventive RFID antenna 28 design, depicted in FIG. 4 were printed and mounted with RFID chips in an analogous fashion to those of examples 1A to 1L. Reading range and impedance measurements on these examples were also made in an analogous fashion to those is Example 1 and are summarized in Table 5.

Example 4A demonstrates that a rectangular inductive circuit may be used, and high reading range still achieved.

Example 4d demonstrates that the orientation of the inductive circuit may be modified and high reading range still achieved.

The comparison of examples 4C and 4D also demonstrates that a small aspect ratio AR is desirable.

TABLE 5

Performances of the antenna designs 4A to 4D

| Example | Antenna | L28 (mm) | MW52 (mm) | L28 (mm) | AR | A50 (mm²) | Z (Ω) | RR (m) |
|---|---|---|---|---|---|---|---|---|
| 4A | FIG. 4 example D | 100 | 15 | 37.5 | 0.40 | 200 | 51.3 + 0.4j | 10 |
| 4B | FIG. 4 example B (rotated) | 100 | 15 | 42.5 | 0.35 | 157 | 52.9 + 6.8j | 10 |
| 4C | FIG. 4 example B | 100 | 15 | 37.5 | 0.40 | 157 | 50 − 4j | 14.6 |
| 4D | FIG. 4 example B | 100 | 35 | 35 | 1.00 | 226 | 51.3 + 0.6j | 6.5 |

Experiment 5—Influence of the Number of Lobes

Several variations of the RFID antenna 28 with multi-lobe designs, depicted in FIG. 8, were printed and mounted with RFID chips in an analogous fashion to those in experiment 1. Reading range and impedance measurements on these examples were also made in an analogous fashion to those of experiments 1. The corresponding results are summarized in Table 6.

Examples 2T and 5A with 2 and 4 lobes respectively, were comprised of lobes which all had a length of 37.5 mm and maximum width MW52 of 15 mm. Example 5A had a total of 4 lobes, two on each side of the inductive circuit. The angle α between the two lobes on each side was 30°. Examples 5B to 5D were comprised of two primary lobes, one on each side of the inductive circuit in a mirror like fashion. The dimensions of these primary lobes were L52=42 mm and MW52=15 mm.

Side lobes on examples 5B to 5D were symmetrically places about the primary lobes with angle α between all the lobes on each side of the inductive circuit of 30°. The dimensions of these side lobes were Lside=22 mm and Wside=10 mm. The decrease in reading range with respect to the increase in the number of lobes is significant with a reduction of more than 50% for antennae with 10 lobes.

TABLE 6

Performances of the antenna designs 5A to 5D compared to design 2T

| Example | # lobes | L28 (mm) | D60 (mm) | α122 (°) | MW52 (mm) | L52 (mm) | W side (mm) | L side (mm) | A50 (mm$^2$) | AR | Z (Ω) | RR (m) |
|---|---|---|---|---|---|---|---|---|---|---|---|---|
| 2T | 2 | 100 | 15 | — | 15 | 37.5 | — | — | 157.0 | 0.40 | 50 − 4j | 16.3 |
| 5A | 4 | 100 | 30 | 30 | 15 | 37.5 | 15 | 37 | 157 | 0.40 | 50 − 0.89j | 15.3 |
| 5B | 6 | 100 | 26 | 30 | 15 | 37.5 | 10 | 22 | 157 | 0.40 | 51 − 12j | 10 |
| 5C | 8 | 100 | 60 | 30 | 15 | 37.5 | 10 | 22 | 157 | 0.40 | 54 − 8j | 7 |
| 5D | 10 | 100 | 36 | 30 | 15 | 37.5 | 10 | 22 | 157 | 0.40 | 52 − 75j | 6.8 |

Example 6—Influence of the Primary Lobe Thickness and Angle Between the Lobes

Several variations of the inventive RFID antenna 28 with 6 lobe designs, depicted in FIG. 7, were printed and mounted with RFID chips in an analogous fashion to those in Example 1. Reading range and impedance measurements on these examples were also made in an analogous fashion to those is Example 1 and summarized in Table 7. Examples 5C and 6A to 6N were comprised of two primary lobes, one on each side of the inductive circuit in a mirror like fashion 4 side lobes, two on each side of the inductive circuit.

Examples 5C and 6A to 6K comprised primary lobes of L52=37.5 mm and MW52 varied from 10 mm to 15 mm and side lobes of Lside=22 mm and Wside of 10 mm. The angle α122 between the lobes on each side varied from 30° in Example 5C to 60° in example 6c. This angle α122 did not have a significant impact on maximum reading range.

Examples 6D to 6G comprised primary lobes of L L52=42 mm and MW52=10 mm and side lobes of Lside=22 mm and Wside of 10 mm. The angle α122 between the lobes on each side varied from 30° in Example 5C to 60° in Example 6C. This angle α122 did not have a significant impact on maximum reading range.

Examples 6H to 6K comprised primary lobes of L L52=37.5 mm and MW52=20 mm and side lobes of Lside=22 mm and Wside of 10 mm. The angle α122 between the lobes on each side varied from 30° in Example 5H to 60° in Example 6K. This angle α122 did not have a significant impact on maximum reading range.

Side lobe dimensions were held constant at tout Wside=10 mm and Lside=22 mm for all antennae of examples 6C, 6G, 6K, and 6L to 6N. The primary lobes dimensions varied such that the aspect radio AR ranged from 0.27 to 0.53 for both the 6 lobe and 10 lobe antennae in these examples 6C, 6G, 6K and 6H to 6N. As can be seen in Table 7, as the aspect ratio AR increases, the reading range decreases in an analogous fashion for the 6 lobe and 10 lobe antenna designs. The 10 lobe antenna designs had a lower reading range than the 6 lobe antenna designs.

TABLE 7

Performances of the antenna designs 6A to 6N compared to design 5A

| Examples | # lobes | L28 (mm) | D60 (mm) | α122 (°) | MW52 (mm) | L52 (mm) | W side (mm) | L side (mm) | A50 (mm$^2$) | AR | Z (Ω) | RR (m) |
|---|---|---|---|---|---|---|---|---|---|---|---|---|
| 5C | 6 | 100 | 26 | 30 | 15 | 37.5 | 10 | 22 | 157 | 0.40 | 51 − 12j | 10 |
| 6A | 6 | 100 | 26 | 35 | 15 | 37.5 | 10 | 22 | 157 | 0.40 | 51 − 116j | 11 |
| 6B | 6 | 100 | 32 | 45 | 15 | 37.5 | 10 | 22 | 157 | 0.40 | 52 − 6j | 11 |
| 6C | 6 | 100 | 36 | 60 | 15 | 37.5 | 10 | 22 | 157 | 0.40 | 54 − 9.8j | 10 |
| 6D | 6 | 100 | 26 | 30 | 10 | 37.5 | 10 | 22 | 157 | 0.27 | 51 − 3j | 11.6 |
| 6E | 6 | 100 | 28 | 35 | 10 | 37.5 | 10 | 22 | 157 | 0.27 | 51 − 0.6j | 12.5 |
| 6F | 6 | 100 | 32 | 45 | 10 | 37.5 | 10 | 22 | 157 | 0.27 | 53 − 4j | 11 |
| 6G | 6 | 100 | 36 | 60 | 10 | 37.5 | 10 | 22 | 157 | 0.27 | 57 − 9j | 8 |
| 6H | 6 | 100 | 26 | 30 | 20 | 37.5 | 10 | 22 | 157 | 0.53 | 62 − 19.8j | 4 |
| 6I | 6 | 100 | 28 | 35 | 20 | 37.5 | 10 | 22 | 157 | 0.53 | 55 − 16j | 9 |
| 6J | 6 | 100 | 32 | 45 | 20 | 37.5 | 10 | 22 | 157 | 0.53 | 58 − 0.42j | 6 |
| 6K | 6 | 100 | 36 | 60 | 20 | 37.5 | 10 | 22 | 157 | 0.53 | 59 − 8j | 5 |
| 6L | 10 | 100 | 34 | 30 | 10 | 37.5 | 10 | 22 | 157 | 0.27 | 54 − 0.8j | 6 |
| 6M | 10 | 100 | 36 | 30 | 15 | 37.5 | 10 | 22 | 157 | 0.40 | 52 − 75j | 6.8 |
| 6N | 10 | 100 | 37 | 30 | 20 | 37.5 | 10 | 22 | 157 | 0.53 | 59 − 22j | 5 |

The invention claimed is:

1. A RFID antenna comprising:
a central inductive circuit, and
at least two lobes extending radially from the central inductive circuit,
wherein an area of the central inductive circuit is less than 300 mm$^2$.

2. The RFID antenna according to claim 1,
wherein each lobe belongs to a respective lobe pair, two lobes of the same lobe pair being symmetrical with relation to the central inductive circuit.

3. The RFID antenna according to claim 1, wherein the at least two lobes comprise primary lobes and at least one side lobe, the angle between the side lobe and one of the primary lobes being less than 90°.

4. The RFID antenna according to claim 3, wherein the angle between the side lobe and one of the primary lobes is less than 60°.

5. The RFID antenna according to claim 3, wherein a width and a length is defined for each lobe, the width of each side lobe being less than the smallest width of the primary lobes and the length of each side lobe being less than the smallest length of the primary lobes.

6. The RFID antenna according to claim 1, wherein the central inductive circuit extends between an internal periphery and an external periphery, a ratio of an area of the central inductive circuit and an area of the internal periphery being comprised between 0.18 and 2.75.

7. The RFID antenna according to claim 1, wherein an aspect ratio is defined for each lobe, the aspect ratio of each lobe being comprised between 0.25 and 2.00.

8. The RFID antenna according to claim 7, wherein the aspect ratio of each lobe is less than 1.00.

9. The RFID antenna according to claim 1, wherein a minimum width is defined for each lobe, the minimum width of each lobe being greater than 0.1 mm.

10. The RFID antenna according to claim 1, wherein the central inductive circuit extends from an internal periphery to an external periphery for which respective diameters are defined, the diameter of the internal periphery being comprised between 8.0 mm and 20.0 mm.

11. The RFID antenna according to claim 10, wherein the difference between the diameters of the internal periphery to the external periphery is greater than 5.0 mm.

12. The RFID antenna according to claim 1, wherein the lobes and the central inductive circuit are made of the same conductive material.

13. The RFID antenna according to claim 1, wherein a length is defined for the antenna, the length of the antenna being greater than 40 mm.

14. The RFID antenna according to claim 13, wherein the length of the antenna is comprised between 80 mm and 100 mm.

15. The RFID antenna according to claim 1, wherein the RFID antenna is adapted to receive and transmit signals at frequencies belonging to a frequency domain extending from 860 MHz to 960 MHz.

16. A RFID tag comprising a RFID antenna according to claim 1, and an RFID chip wherein said RFID chip is electrically connected to said central inductive circuit of said RFID antenna.

17. The RFID antenna according to claim 1, wherein the at least two lobes comprise primary lobes and at least one side lobe, the angle between the side lobe and one of the primary lobes being less than 60°.

18. A method for manufacturing a RFID tag, the method for manufacturing comprising a step of forming a RFID antenna on a substrate, the RFID antenna comprising:
a central inductive circuit, and
at least two lobes extending radially from the central inductive circuit, a minimum width being defined for each lobe, the minimum width of each lobe being greater than 0.1 mm,
the step of forming being carried out using a process chosen among a conductive metal transfer printing, conductive inkjet printing and conductive screen printing.

19. The method for manufacturing a RFID tag according to claim 18, the method for manufacturing comprising:
cutting a RFID antenna from a metal foil, the RFID antenna comprising:
a central inductive circuit, and
at least two lobes extending radially from the central inductive circuit, and
adhesively attaching the RFID antenna to the substrate.

20. The method for manufacturing a RFID tag according to claim 18, the method for manufacturing comprising:
a step of providing a substrate metallized with a continuous layer of metal,
a step of forming a RFID antenna comprising:
a central inductive circuit, and
at least two lobes extending radially from the central inductive circuit,
the step of forming being carried out by removing metal from the substrate outside of the areas devoted to form the RFID antenna by using a chemical technique or mechanical etching.

21. A RFID antenna comprising:
a central inductive circuit, and
at least two lobes extending radially from the central inductive circuit, a minimum width being defined for each lobe, the minimum width of each lobe being greater than 0.1 mm.

22. A RFID antenna comprising:
a central inductive circuit, and
at least two lobes extending radially from the central inductive circuit, the central inductive circuit extending from an internal periphery to an external periphery for which respective diameters are defined, the diameter of the internal periphery being comprised between 8.0 mm and 20.0 mm.

23. A RFID antenna comprising:
a central inductive circuit, and
at least two lobes extending radially from the central inductive circuit, the lobes and the central inductive circuit being made of the same conductive material.

\* \* \* \* \*